(12) United States Patent
Yamasaki et al.

(10) Patent No.: US 10,557,211 B2
(45) Date of Patent: Feb. 11, 2020

(54) SUBSTRATE TRANSPORTING APPARATUS, CONTROL APPARATUS FOR SUBSTRATE TRANSPORTING APPARATUS, DISPLACEMENT COMPENSATION METHOD FOR SUBSTRATE TRANSPORTING APPARATUS, PROGRAM FOR IMPLEMENTING METHOD AND RECORDING MEDIUM THAT RECORDS PROGRAM

(71) Applicant: EBARA CORPORATION, Tokyo (JP)

(72) Inventors: Gaku Yamasaki, Tokyo (JP); Hirotaka Ohashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/933,280

(22) Filed: Mar. 22, 2018

(65) Prior Publication Data

US 2018/0282893 A1 Oct. 4, 2018

(30) Foreign Application Priority Data

Mar. 28, 2017 (JP) ................................ 2017-063070

(51) Int. Cl.
*C25D 17/06* (2006.01)
*B25J 5/02* (2006.01)
(Continued)

(52) U.S. Cl.
CPC ............... *C25D 17/06* (2013.01); *B25J 5/02* (2013.01); *B25J 9/023* (2013.01); *B25J 9/1669* (2013.01); *B25J 9/1676* (2013.01); *B25J 9/1697* (2013.01); *B25J 11/0095* (2013.01); *C25D 17/001* (2013.01); *C25D 21/12* (2013.01); *H01L 21/6723* (2013.01); *H01L 21/67173* (2013.01); *H01L 21/67718* (2013.01); *H01L 21/67733* (2013.01); *H01L 21/67742* (2013.01); *H01L 21/67751* (2013.01); *H01L 21/68707* (2013.01); *H01L 21/68764* (2013.01);
(Continued)

(58) Field of Classification Search
CPC ....... C25D 17/06; C25D 17/001; C25D 17/12
USPC .................................. 205/157; 414/277, 591
See application file for complete search history.

(56) References Cited

U.S. PATENT DOCUMENTS 10,242,898 B2 * 3/2019 Kinugawa ......... H01L 21/67259
2015/0357213 A1 * 12/2015 Yokoyama ........ H01L 21/67086
438/747

FOREIGN PATENT DOCUMENTS

JP 2016-018847 A 2/2016

* cited by examiner

*Primary Examiner* — Ronald P Jarrett
(74) *Attorney, Agent, or Firm* — Baker Hostetler LLP

(57) ABSTRACT

In assembly of a conventional plating apparatus, a position of a processing tank is adjusted so that the processing tank is disposed at an ideal position. This adjustment takes time and effort to assemble a plating apparatus, and assembly of the plating apparatus requires a high cost. The invention provides a substrate transporting apparatus provided with a substrate holder for holding a substrate, a holder griping mechanism that grips the substrate holder, a substrate transporting section that transports the substrate holder, a rotation mechanism that rotationally moves the holder griping mechanism around a vertical direction as an axis, and a linear motion mechanism that linearly moves the holder griping mechanism in a direction perpendicular to a plane defined by a transporting direction of the substrate holder by the substrate transporting section and a vertical direction.

5 Claims, 13 Drawing Sheets

(51) Int. Cl.
*B25J 11/00* (2006.01)
*B25J 9/16* (2006.01)
*H01L 21/677* (2006.01)
*H01L 21/687* (2006.01)
*C25D 21/12* (2006.01)
*B25J 9/02* (2006.01)
*C25D 17/00* (2006.01)
*H01L 21/67* (2006.01)
*C23C 18/16* (2006.01)

(52) U.S. Cl.
CPC ........... *C23C 18/163* (2013.01); *Y10S 901/47* (2013.01); *Y10S 901/49* (2013.01)

SUBSTRATE TRANSPORTING APPARATUS, CONTROL APPARATUS FOR SUBSTRATE TRANSPORTING APPARATUS, DISPLACEMENT COMPENSATION METHOD FOR SUBSTRATE TRANSPORTING APPARATUS, PROGRAM FOR IMPLEMENTING METHOD AND RECORDING MEDIUM THAT RECORDS PROGRAM

CROSS-REFERENCE TO RELATED APPLICATION

This application is based upon and claims benefit of priority from Japanese Patent Application No. 2017-063070 filed on Mar. 28, 2017, the entire contents of which are incorporated herein by reference.

TECHNICAL FIELD

The present application relates to a substrate transporting apparatus, a control apparatus for the substrate transporting apparatus, a displacement compensation method for the substrate transporting apparatus, a program for implementing the method and a recording medium that records the program.

BACKGROUND ART

One of semiconductor manufacturing apparatuses is a plating apparatus that wires metal on a substrate surface. In a technique called "wet plating," a substrate is immersed in a plating liquid, electrical or chemical reaction is caused to take place on the substrate surface and the metal in the plating liquid is thereby plated onto the substrate. A normal plating apparatus is provided with a plurality of processing tanks (pre-wet tank, plating tank, water washing tank, drying tank or the like). Furthermore, throughput of the plating apparatus can be improved by arranging a plurality of tanks in series as a substrate processing line and successively processing the plurality of substrates.

A substrate processing apparatus is known which is provided with a transporting device in the vicinity of a plurality of processing tanks to transport a substrate among respective processing tanks (PTL 1). The transporting device described in PTL 1 is provided with a guide rail provided in a linear form. The guide rail is provided along a direction substantially parallel to the direction in which the processing tanks are arranged.

CITATION LIST

Patent Literature

PTL 1: Japanese Patent Application Laid-Open No. 2016-18847

SUMMARY OF INVENTION

Technical Problem

PTL 1 presupposes a situation in which the processing tanks are arranged at ideal positions. However, there can be manufacturing errors and assembly errors in manufacturing and assembly of the actual apparatus. Especially when the plating apparatus is large, it is difficult to manufacture and assemble large parts without errors. Due to manufacturing errors and assembly errors, there can be displacements from ideal positions or shapes of the processing tanks.

When a conventional plating apparatus houses a substrate in a processing tank, displacement of the processing tank may not be taken into consideration. For that reason, when displacement exists in the processing tank, the plating apparatus may not be able to house the substrate at a predetermined position of the processing tank. For example, in an electrolytic plating step, a current density on the substrate influences plating quality. If electrolytic plating is performed while the position at which the substrate is housed is not a predetermined position of the processing tank, the current density may deviate from a desired value. Therefore, displacement of the processing tank can adversely affect the plating quality.

In the case of assembly of the conventional plating apparatus, the position of the processing tank is adjusted to reduce displacement or influences of displacement of the processing tank. This adjustment requires time and effort in assembly of the plating apparatus and requires high assembly cost.

This problem is not limited to the plating apparatus. This problem is a problem generally found in substrate transporting apparatuses provided with a plurality of tanks or containers, and housing substrates in those tanks or the like. It is therefore an object of the present invention to provide a substrate transporting apparatus, a control apparatus for the substrate transporting apparatus, a displacement compensation method for the substrate transporting apparatus, a program for implementing the method and a recording medium that records the program capable of solving at least some of the above-described problems.

Solution to Problem

As an embodiment, the present application discloses a substrate transporting apparatus provided with a substrate holder for holding a substrate, a holder griping mechanism for griping the substrate holder, a substrate transporting section that transports the substrate holder, a rotation mechanism that rotationally moves the holder griping mechanism around a vertical direction as an axis, and a linear motion mechanism that linearly moves the holder griping mechanism in a direction perpendicular to a plane defined by a transporting direction of the substrate holder by the substrate transporting section and a vertical direction.

BRIEF DESCRIPTION OF DRAWINGS

FIG. 6 is a top view of the electrolytic plating apparatus according to the first embodiment that illustrates a situation in which displacement of each processing tank is compensated for;

DESCRIPTION OF EMBODIMENTS

First Embodiment

Figure 1:
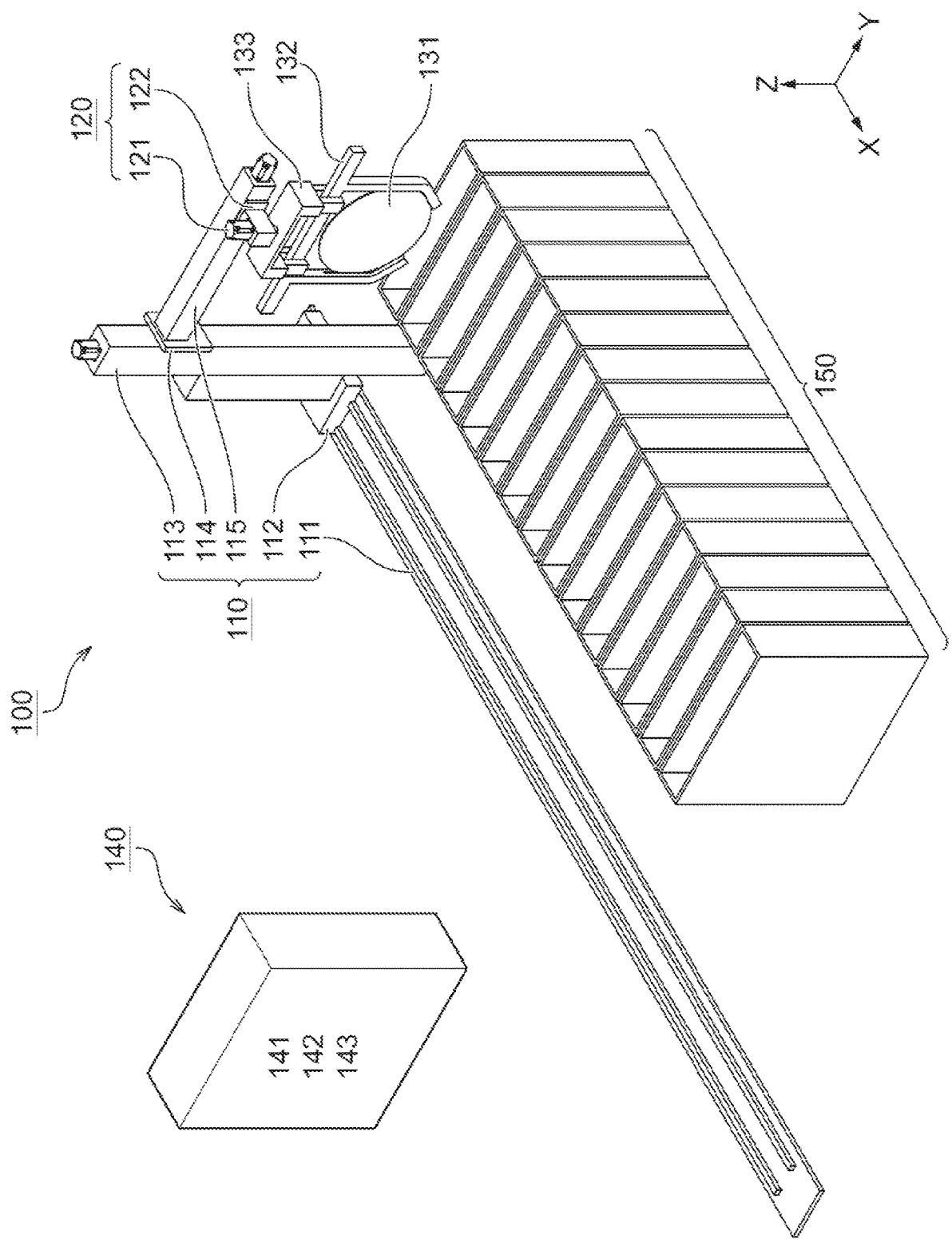
FIG. 1 is a perspective view of an electrolytic plating apparatus according to a first embodiment.

FIG. 1 is a perspective view of an electrolytic plating apparatus 100 according to a first embodiment. The electrolytic plating apparatus 100 in the present embodiment is a wet electrolytic plating apparatus. The electrolytic plating apparatus 100 may be a dry plating apparatus or an electroless plating apparatus. The electrolytic plating apparatus 100 may also be a substrate transporting apparatus provided with a plurality of tanks or containers to house substrates in those tanks or the like. Substrates used in the present embodiment have a circular shape. However, substrates of any shape (rectangular shape or the like) can be used.

The electrolytic plating apparatus 100 comprises a substrate transporting section 110 including a horizontal guide 111, a horizontal transporting mechanism 112, a vertical guide 113, a vertical transporting mechanism 114 and an arm 115. The substrate transporting section 110 is provided to transport a substrate 131 and/or a substrate holder 132. The horizontal guide 111 is formed into a linear shape. Hereinafter, a longitudinal direction (X-axis direction in FIG. 1) of the horizontal guide 111 is referred to as a "substrate transporting direction," "substrate holder transporting direction," "transporting direction of the electrolytic plating apparatus" or simply "transporting direction" or the like. The horizontal transporting mechanism 112 is provided on the horizontal guide 111. The horizontal transporting mechanism 112 is a mechanism to move the substrate 131 in the transporting direction. The vertical guide 113 is provided on the horizontal transporting mechanism. The longitudinal direction of the vertical guide 113 is a vertical direction (Z-axis direction in FIG. 1). The vertical transporting mechanism 114 is provided on the vertical guide 113. The vertical transporting mechanism 114 is a mechanism to move the substrate 131 in the vertical direction. The arm 115 is provided on the vertical transporting mechanism 114. The longitudinal direction of the arm 115 is a direction perpendicular to a plane defined by the transporting direction and the vertical direction (the longitudinal direction of the arm 115 is Y-axis direction in FIG. 1). However, the configuration of the substrate transporting section 110 is not limited to the aforementioned example, and parts can be added, deleted or changed as appropriate. For example, instead of the vertical transporting mechanism 114, a lifter that can receive the substrate 131 (or a member that holds the substrate) from the arm 115 can be adopted.

The substrate 131 is held by the substrate holder 132 and the substrate holder 132 is connected to and griped by a holder griping mechanism 133. The holder griping mechanism 133 is provided near a distal end of the arm 115 via a moving mechanism 120 which will be described later. The holder griping mechanism 133 is configured to be able to release griping of the substrate holder 132. The substrate holder 132 may also be able to hold a plurality of substrates 131. The holder griping mechanism 133 may also be able to grip a plurality of substrate holders 132.

The electrolytic plating apparatus 100 further comprises a control unit 140 that controls respective components. The control unit 140 can also include a control apparatus 141, a storage (memory) apparatus 142, an input apparatus 143 and a display apparatus (not shown) or the like.

The electrolytic plating apparatus 100 further comprises a processing tank(s). The electrolytic plating apparatus 100 of the present embodiment comprises a plurality of processing tanks 150, whereas the number of the processing tank(s) may also be one. In the example in FIG. 1, a plurality of processing tanks 150 are provided at a position adjacent to the horizontal guide 111 and below the arm 115 along a longitudinal direction of the horizontal guide 111 (the arm 115 is located above the plurality of processing tanks 150). However, the positions of the processing tanks are examples and the processing tanks may have any positional relationship with respect to the horizontal guide 111 and the arm 115. The respective shapes of the plurality of processing tanks 150 are at least rectangular parallelepiped shapes having an opening at their tops. However, the shapes of the processing tanks are shown as examples. Each of the plurality of processing tanks 150 may be various tanks (pre-wet tank, plating tank, water washing tank, drying tank or the like) that house the substrate 131 and the substrate holder 132 to process the substrate 131. For example, a plating liquid is supplied into the plating tank. In the plating tank, a metal in the plating liquid can be plated onto the substrate 131. For example, pure water is supplied into the water washing tank. With the water washing tank, the substrate 131 after plating can be washed/cleaned with pure water. Any number of processing tanks can be installed in the electrolytic plating apparatus 100. As an example, the electrolytic plating apparatus 100 can be provided with 2 to 10 processing tanks. Large electrolytic plating apparatuses may be provided with 30 or more processing tanks.

The electrolytic plating apparatus 100 in FIG. 1 holds the substrate 131 such that the direction perpendicular to the surface of the substrate 131 coincides with the transporting direction (to put it simply, the electrolytic plating apparatus 100 hangs the substrate vertically). Instead, an electrolytic plating apparatus may be used which holds the substrate 131 such that the direction perpendicular to the surface of the substrate 131 coincides with the vertical direction (to put it simply, an electrolytic plating apparatus that holds the substrate horizontally may be used). In that case, a columnar or bawl-like processing tank may be used.

The electrolytic plating apparatus 100 transports the substrate 131 among the plurality of processing tanks 150 by combining (1) movement of the substrate 131 in the X-axis direction by the horizontal transporting mechanism 112 and (2) movement of the substrate 131 in the Z-axis direction by the vertical transporting mechanism 114. Operation of the electrolytic plating apparatus 100, when the apparatus transports and houses the substrate 131 and the substrate holder 132 housed in a certain processing tank to/in another processing tank, will be described.

The control apparatus 141 controls the vertical transporting mechanism 114 to move the arm 115 upward or downward in the vertical direction until the arm 115 reaches a position where no interference occurs among parts during transportation of the substrate.

Next, the control apparatus 141 controls the horizontal transporting mechanism 112 to dispose the holder griping mechanism 133 above a processing tank in which the substrate 131 and substrate holder 132 to be transported are housed.

Next, the control apparatus 141 controls the vertical transporting mechanism 114 to move the arm 115 downward in the vertical direction until the holder griping mechanism 133 reaches a position where the substrate holder 132 can be griped.

Next, the control apparatus 141 controls the holder griping mechanism 133 to grip the substrate holder 132 by the holder griping mechanism 133.

Next, the control apparatus 141 controls the vertical transporting mechanism 114 to move the arm 115 upward in the vertical direction until the arm 115 reaches a position where no interference occurs among parts during transportation of the substrate.

Next, the control apparatus 141 controls the horizontal transporting mechanism 112 to move the holder griping mechanism 133 above a processing tank which is a transportation destination.

Next, the control apparatus 141 controls the vertical transporting mechanism 114 to move the arm 115 downward in the vertical direction. As the arm 115 descends, the substrate 131 and the substrate holder 132 are housed in a processing tank which is a transportation destination.

Finally, the control apparatus 141 controls the holder griping mechanism 133 to release griping of the substrate holder 132 by the holder griping mechanism 133.

As substrates become larger in size and plating steps become more complicated in recent years, the electrolytic plating apparatus 100 tends to increase in size. The size of a processing tank in a large plating apparatus may become on the order of 1 m high, 1 m wide and 30 cm deep, for example. It is difficult to manufacture or assemble such a large processing tank without errors. There can be displacements from an ideal position or shape of each processing tank caused by manufacturing errors and assembly errors.

A displacement between an actual position and an ideal position of a processing tank and a displacement between an actual shape and an ideal shape of each processing tank are generically called "displacement of the processing tank" in the present specification. Examples of displacement of each processing tank include displacement caused by manufacturing errors, displacement caused by assembly errors, and displacement caused by deformation; any displacements caused by any causes will be included. A displacement of each processing tank includes displacement that can be expressed by an amount of rotation around any given direction as an axis and displacement that can be expressed by an amount of linear motion in any given direction. In particular, a displacement of each processing tank includes angular displacement and linear displacement. The "angular displacement" in the present specification is a displacement that can be expressed by an amount of rotation around the Z-axis direction as an axis. The "linear displacement" in the present specification is a displacement that can be expressed by an amount of linear motion in the Y-axis direction.

Figure 2:
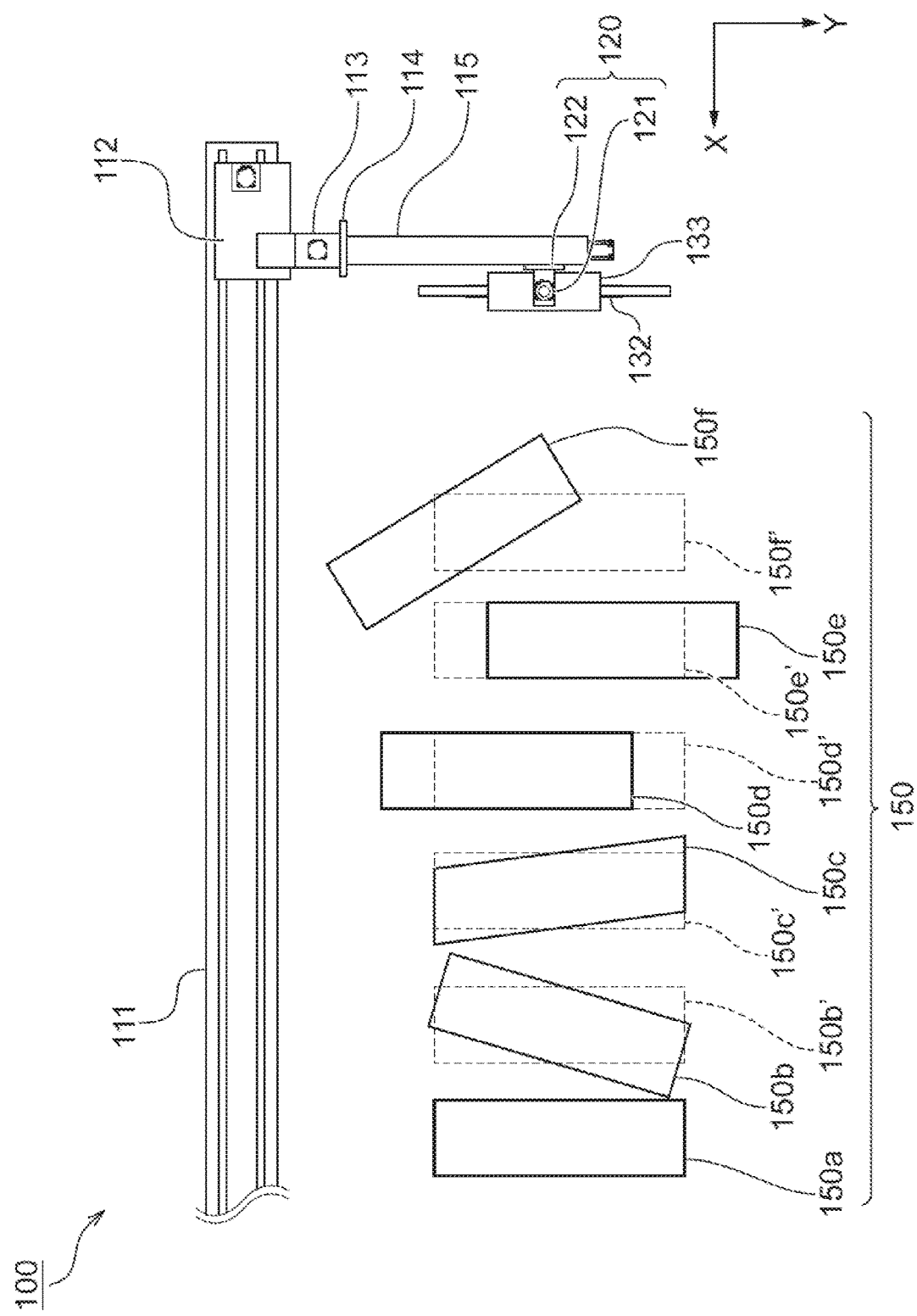
FIG. 2 is a top view of the electrolytic plating apparatus according to the first embodiment.

FIG. 2 is a top view of the electrolytic plating apparatus 100 according to the present embodiment. FIG. 2 illustrates processing tanks having displacements from an ideal position or shape. Ideal positions or shapes 150b' to 150f' of the processing tanks are shown by dotted lines in FIG. 2. For convenience of description, an amount of displacement of each processing tank is exaggeratedly shown in FIG. 2.

In the example in FIG. 2, a first processing tank 150a is disposed at an ideal position and formed into an ideal shape. A second processing tank 150b is disposed inclined from the ideal position 150b'. That is, a long side of the second processing tank 150b when seen from a top view is not orthogonal to a longitudinal direction of the horizontal guide 111. A third processing tank 150c is formed into a parallelogram shape when seen from a top view and not formed into a rectangular shape as the ideal shape 150c'. A fourth processing tank 150d is disposed at a position closer to the horizontal guide 111 than the ideal position 150d'. A fifth processing tank 150e is disposed at a position farther from the horizontal guide 111 than the ideal position 150e'. A sixth processing tank 150f is disposed inclined from the ideal position 150 and disposed at a position closer to the horizontal guide 111. That is, in the example in FIG. 2, the second, third and sixth processing tanks have angular displacements and the fourth, fifth and sixth processing tanks have linear displacements.

Conventional apparatuses have not taken displacements of processing tanks into consideration when housing substrates in the processing tanks. Therefore, when there are displacements in the processing tanks like the second to sixth processing tanks 150b to 150f, the plating apparatus may be unable to house the substrate 131 at predetermined position of each processing tank.

In an electrolytic plating step, a current density on the substrate 131 influences plating quality. When electrolytic plating is performed while the substrate 131 is not located at a predetermined position of the processing tank, the current density may deviate from a desired value, which may degrade the plating quality. An example of the allowable amount of displacement of the processing tanks 150 for the plating apparatus can be on the order of 1 millimeter within the XY plane in FIG. 2. Therefore when the conventional electrolytic plating apparatus 100 is assembled, positions of the respective processing tanks are adjusted to reduce displacements or influences of displacements of the respective processing tanks.

Not only manufacturing errors or assembly errors, but also the liquid in the processing tank may cause displacement in the processing tank. As an example, when a processing tank in a size of 1 m high, 1 m wide and 30 centimeters deep is completely filled with water, the mass of the water becomes approximately 300 kilograms per tank (0.3 cubic meters×1000 kilograms/cubic meter).

The weight corresponding to the mass of the liquid in the processing tank may possibly deform each processing tank and/or other parts (housing of the apparatus or the like). The deformation of each processing tank and/or other parts by the liquid can also cause displacement of each processing tank. For this reason, it is preferable to adjust the positions of the processing tanks by taking into account the deformation of the processing tanks and/or other parts by the liquid. However, it may be difficult to connect a pipe for supplying the liquid and then adjust the positions of the processing tanks. In that case, it is also difficult to adjust the positions of the processing tanks while measuring the actual amount of deformation of the processing tanks and/or other parts. Therefore, the positions of the processing tanks may be adjusted not based on the actual amount of deformation but based on the amount of deformation calculated in advance. However, it is difficult to calculate the amount of deformation of the processing tanks and/or other parts with high accuracy and it may consume a very large amount of time, effort and cost.

The large electrolytic plating apparatus 100 may include many processing tanks. As the number of processing tanks increases, time and effort to adjust the positions of processing tanks increases. The large electrolytic plating apparatus 100 may be divided into a plurality of units for transportation. The plurality of divided units are combined together at a delivery destination. Displacements of the processing tanks can also be produced by division or combination of units. It is difficult to dispatch or send personnel and facilities to the delivery destination to adjust the positions of processing tanks, and doing so may take much time, effort and cost.

As described above, the conventional substrate transporting apparatus including the electrolytic plating apparatus takes a longer time to assemble the apparatus due to adjustment of the positions of the processing tanks and requires higher assembly cost.

Figure 3:
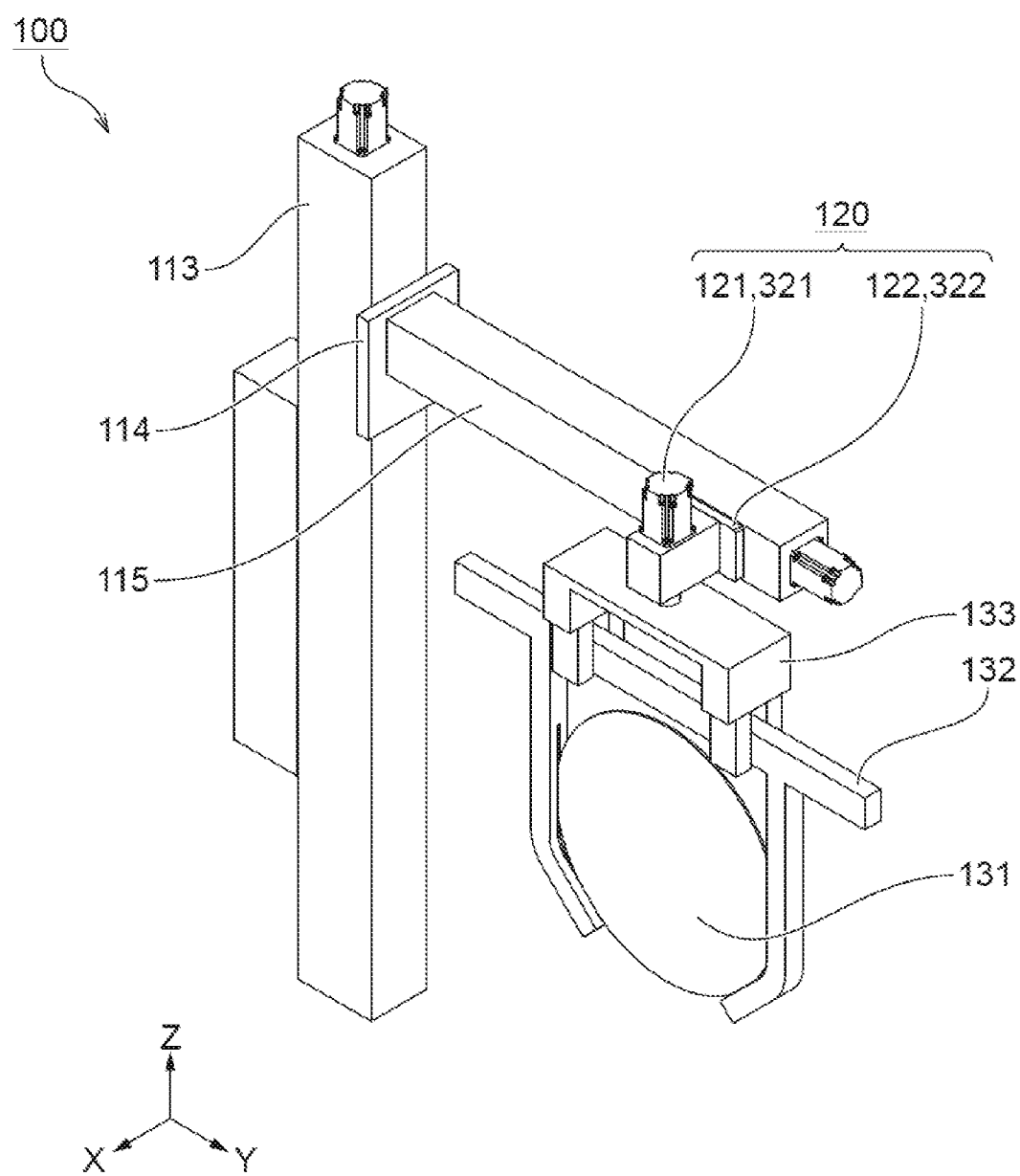
FIG. 3 is a perspective view of a portion of the electrolytic plating apparatus near an arm according to the first embodiment.

The electrolytic plating apparatus 100 according to the present embodiment has a configuration for compensating for displacements of the respective processing tanks. FIG. 3 is a perspective view of a portion of the electrolytic plating apparatus 100 near the arm 115 according to the present embodiment. The electrolytic plating apparatus 100 according to the present embodiment is provided with a moving mechanism 120 near the distal end of the arm 115. The moving mechanism 120 is a mechanism independent of the substrate transporting section 110 for moving the holder griping mechanism 133. The moving mechanism 120 includes a rotation mechanism 121 and a linear motion mechanism 122.

Figure 4:
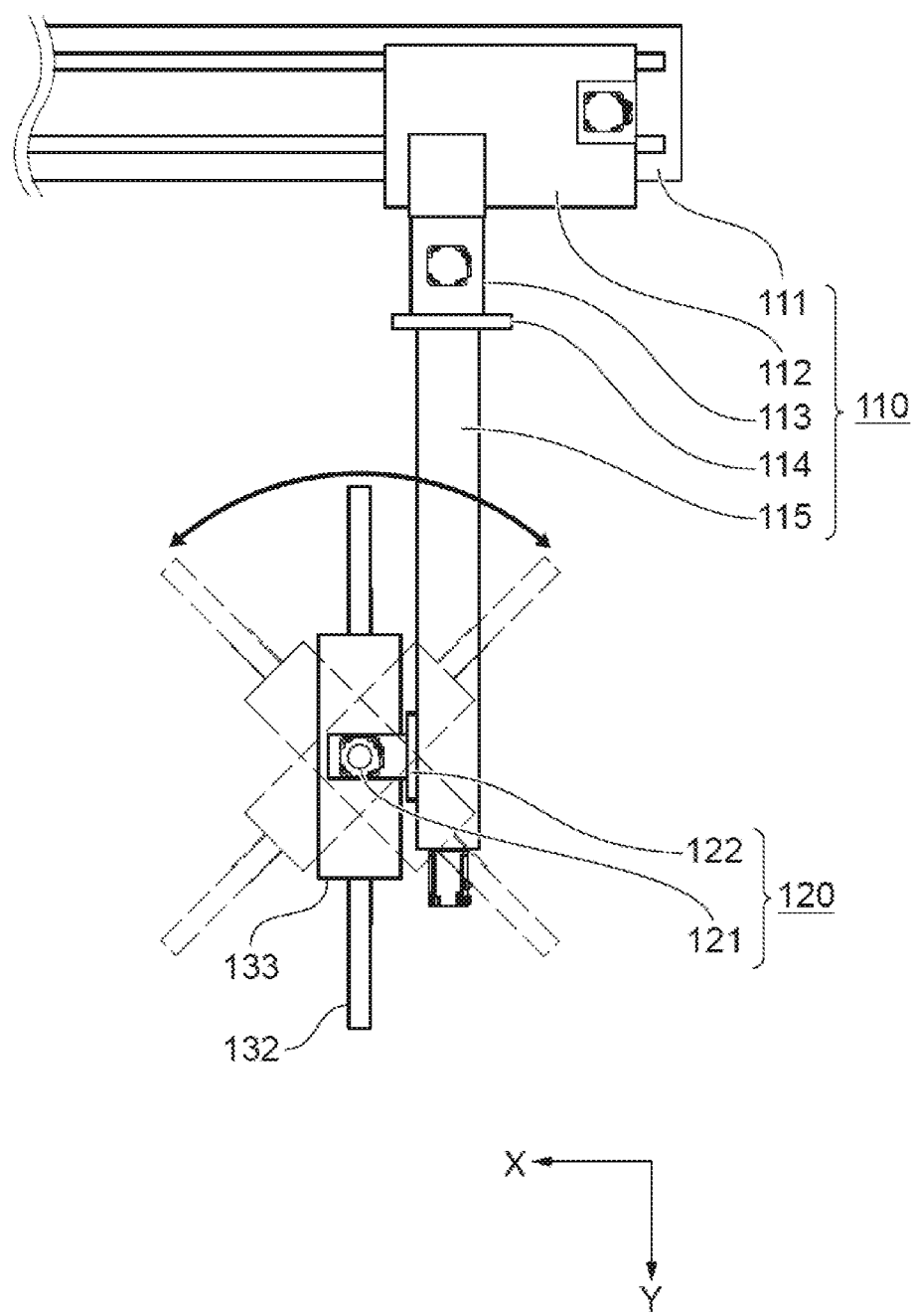
FIG. 4 is a top view of a portion of the electrolytic plating apparatus near the arm according to the first embodiment that illustrates rotation movement of a holder griping mechanism by a rotation mechanism.

The rotation mechanism 121 is a mechanism for rotationally moving the holder griping mechanism 133 around the vertical direction (the Z-axis direction) as an axis. FIG. 4 is a top view of a portion of the electrolytic plating apparatus 100 near the arm 115 according to the present embodiment. FIG. 4 illustrates rotational movement of the holder griping mechanism 133 by the rotation mechanism 121 (which rotationally moves in a direction indicated by an arrow in FIG. 4). As shown in FIG. 4, the rotation mechanism 121 can rotationally move in both clockwise and counterclockwise directions when seen from the top view.

Figure 5:
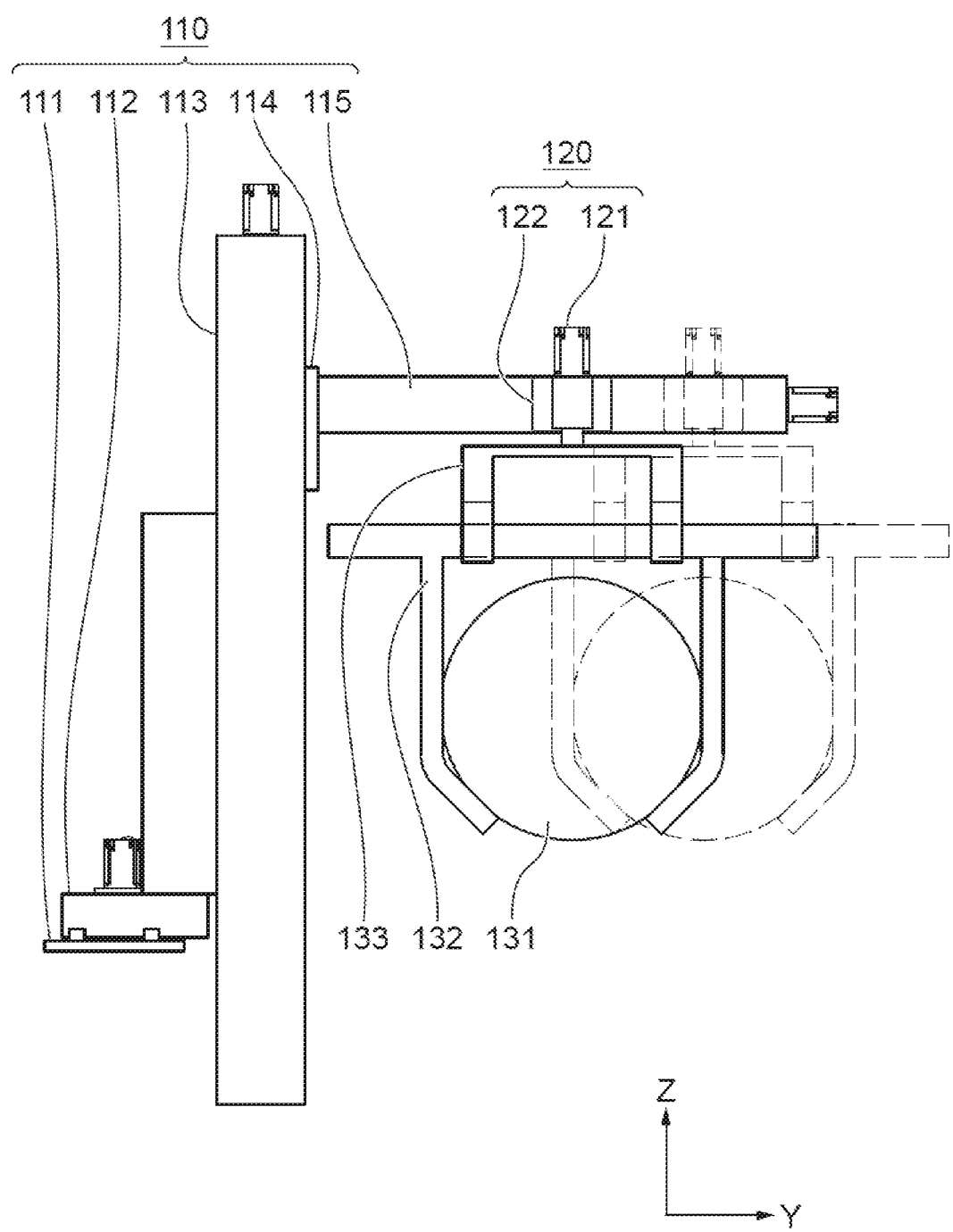
FIG. 5 is a left side view of a portion of the electrolytic plating apparatus near the arm according to the first embodiment that illustrates linear movement of the holder griping mechanism by the linear motion mechanism.

The linear motion mechanism 122 is a mechanism that linearly moves the holder griping mechanism 133 along the longitudinal direction (Y-axis direction) of the arm 115. FIG. 5 is a left side view of the electrolytic plating apparatus 100 according to the present embodiment (note that, a positive direction of the Y-axis shown in FIG. 1 to FIG. 4 is assumed to be the front of the electrolytic plating apparatus 100). FIG. 5 illustrates linear movement of the holder griping mechanism 133 by the linear motion mechanism 122 (which linearly moves in a direction indicated by an arrow in FIG. 5). As shown in FIG. 5, the linear motion mechanism 122 can linearly move in both directions: direction away from the horizontal guide 111; and direction closer to the horizontal guide 111.

The holder griping mechanism 133 can grip the substrate holder 132 and the substrate holder 132 can hold the substrate 131. Thus, when the substrate 131 is held and the substrate holder 132 is griped, the rotation mechanism 121 causes the holder griping mechanism 133 to rotationally move, and then the substrate 131 and the substrate holder 132 thereby also rotationally move. Similarly, the linear motion mechanism 122 causes the holder griping mechanism 133 to linearly move, and then the substrate 131 and the substrate holder 132 thereby also linearly move.

In this example, the rotation mechanism 121 is provided on the arm 115 via the linear motion mechanism 122. Furthermore, the holder griping mechanism 133 is provided on the arm 115 via the rotation mechanism 121. The positional relationship between these elements is an example, and these elements may also have any given positional relationship with respect to the arm 115. The electrolytic plating apparatus 100 may be provided with either of the rotation mechanism 121 and the linear motion mechanism 122 as the moving mechanism 120. The rotation mechanism 121 may comprise a rotary encoder 321. The linear motion mechanism 122 may comprise a linear encoder 322. The control apparatus 141 can accurately control operation of each mechanism by controlling each mechanism under a closed loop scheme using an encoder.

Figure 6:
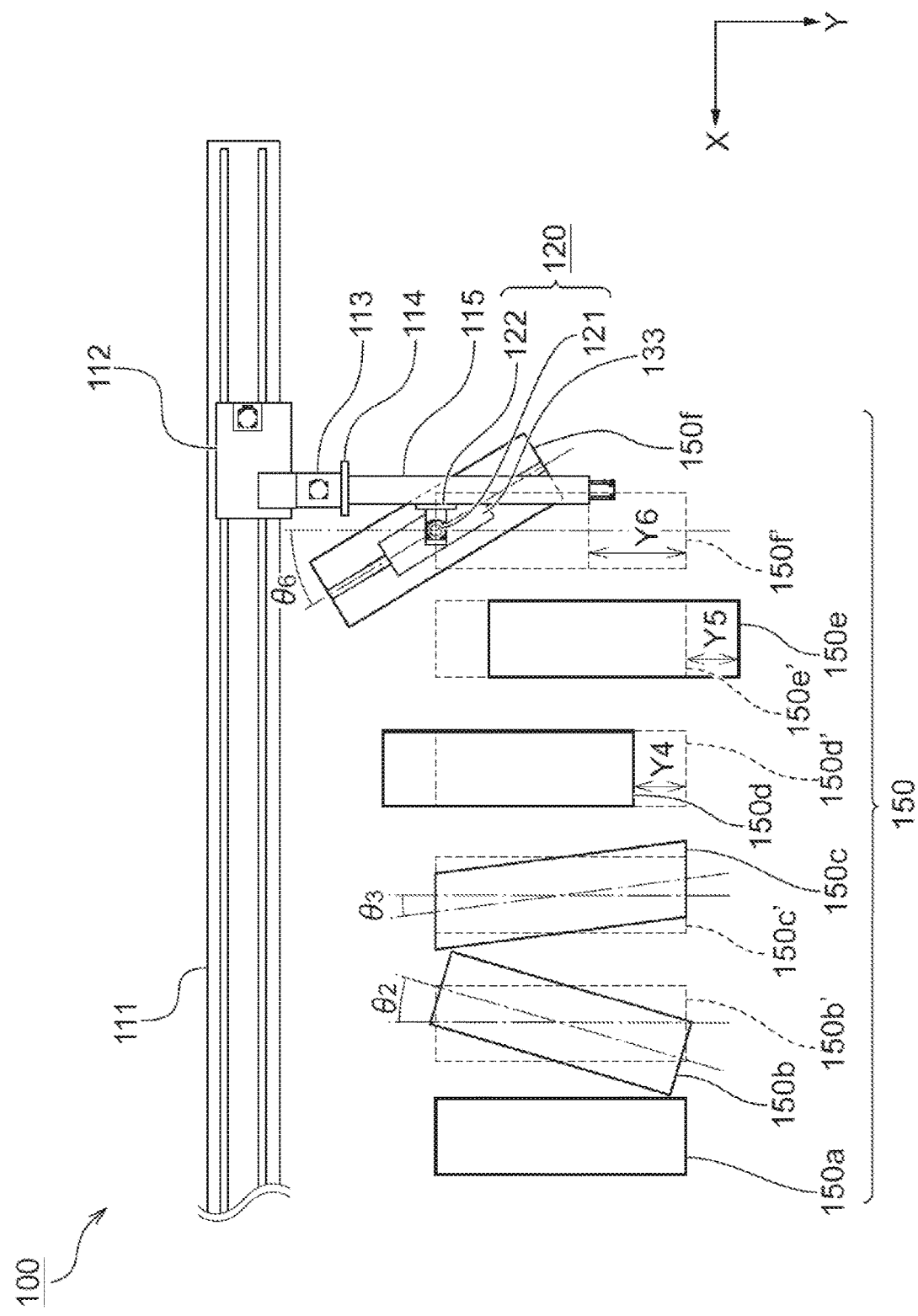

FIG. 6 is a top view of the electrolytic plating apparatus 100 according to the present embodiment, showing a situation in which the electrolytic plating apparatus 100 compensates for displacement of each processing tank. FIG. 6 illustrates a case where the substrate 131 and the substrate holder 132 are housed in the sixth processing tank 150f. The electrolytic plating apparatus 100 combines (1) movement of the substrate 131 in the X-axis direction by the horizontal transporting mechanism 112, (2) movement of the substrate 131 in the Z-axis direction by the vertical transporting mechanism 114, (3) rotational movement of the holder griping mechanism 133 around the Z-axis direction by the rotation mechanism 121 and (4) linear movement of the holder griping mechanism 133 in the Y-axis direction by the linear motion mechanism 122 to thereby transport the substrate 131 among a plurality of processing tanks and compensate for displacements of the respective processing tanks. The control apparatus 141 controls the rotation mechanism 121 and the linear motion mechanism 122 based on displacement compensation values relating to the processing tanks.

The "compensation for displacement of the processing tank" in the present specification refers to bringing the housing position of the substrate in the processing tank having displacement closer to a predetermined position by some means, that is, cancelling displacement of the processing tank. However, the "compensation for displacement of a processing tank" is not limited to completely cancelling displacement of the processing tank. The electrolytic plating apparatus 100 according to the present embodiment compensates for displacement of the processing tank by operating the moving mechanism 120.

The "displacement compensation value relating to the processing tank" in the present specification refers to an amount of movement of the holder griping mechanism 133 for compensating for displacement of the processing tank. Here, the "amount of movement of the holder griping mechanism" includes the amount of rotation of the holder griping mechanism 133 around any given direction and the amount of linear motion of the holder griping mechanism in any given direction. A displacement compensation value relating to an n-th processing tank includes an angular displacement compensation value $\theta_n$ and a linear displacement compensation value $Y_n$.

The "angular displacement compensation value $\theta_n$" in the present specification refers to an amount of rotation of the holder griping mechanism 133 by the rotation mechanism 121 to compensate for angular displacement of the n-th processing tank. The angular displacement compensation value $\theta_n$ preferably coincides with the angular displacement of the n-th processing tank. Hereinafter, an angular displacement compensation value $\theta_n$ when the angular displacement of the processing tank is 0 is assumed to be 0.

The "linear displacement compensation value $Y_n$" in the present specification refers to an amount of linear motion of the holder griping mechanism 133 by the linear motion mechanism 122 to compensate for linear displacement of the n-th processing tank. The linear displacement compensation value $Y_n$ preferably coincides with the linear displacement of the n-th processing tank. Hereinafter, the linear displacement compensation value $Y_n$ when the linear displacement of the processing tank is 0 is assumed to be 0.

In the example in FIG. 6, the first processing tank 150a has no displacement. Therefore, both an angular displacement compensation value $\theta_1$ and a linear displacement compensation value $Y_1$ relating to the first processing tank 150a are 0. When the substrate 131 and the substrate holder 132 are housed in the first processing tank 150a, the control apparatus 141 controls the rotation mechanism 121 and the linear motion mechanism 122 to set the amount of rotation and the amount of linear motion of the holder griping mechanism 133 to 0. Then, the control apparatus 141 controls the vertical transporting mechanism 114 to house the substrate 131 and the substrate holder 132 in the first processing tank 150a.

Since the second processing tank 150b has angular displacement, an angular displacement compensation value $\theta_2$ relating to the second processing tank 150b becomes a non-zero specific value. When the substrate 131 and the substrate holder 132 are housed in the second processing tank 150b, the control apparatus 141 controls the rotation mechanism 121 to rotationally move the holder griping mechanism 133 by $\theta2$. In this case, the amount of linear motion of the holder griping mechanism 133 by the linear motion mechanism 122 is 0. After that, the control apparatus 141 controls the vertical transporting mechanism 114 to house the substrate 131 and the substrate holder 132 in the second processing tank 150b. The same applies to the third processing tank 150c as it applies to the second processing tank 150b.

Since the fourth processing tank 150d has linear displacement, a linear displacement compensation value $Y_4$ relating to the fourth processing tank 150d becomes a non-zero specific value. When the substrate 131 and the substrate holder 132 are housed in the fourth processing tank 150d, the control apparatus 141 controls the linear motion mechanism 122 to linearly move the holder griping mechanism 133 by $Y_4$. In this case, the amount of rotation of the holder griping mechanism 133 by the rotation mechanism 121 is 0. After that, the control apparatus 141 controls the vertical transporting mechanism 114 to house the substrate 131 and substrate holder 132 in the fourth processing tank 150d. The same applies to the fifth processing tank 150e as it applies to the fourth processing tank 150d.

Since the sixth processing tank 150f has both angular displacement and linear displacement, an angular displacement compensation value $\theta_6$ and a linear displacement compensation value $Y_6$ relating to the sixth processing tank 150f become non-zero specific values. When the substrate 131 and the substrate holder 132 are housed in the sixth processing tank 150f, the control apparatus 141 controls the rotation mechanism 121 to rotationally move the holder griping mechanism 133 by $\theta_6$. Furthermore, the control apparatus 141 controls the linear motion mechanism 122 to linearly move the holder griping mechanism 133 by $Y_6$.

After that, the control apparatus 141 controls the vertical transporting mechanism 114 to house the substrate 131 and substrate holder 132 in the sixth processing tank 150f.

According to the substrate transporting apparatus that performs the above-described control or the control apparatus for the substrate transporting apparatus or the above-described displacement compensation method, even when displacement occurs in a processing tank, displacement thereof can be compensated for. In other words, when the apparatus is assembled, positional adjustment of the processing tank becomes unnecessary, thus saving time, effort and cost to assemble the apparatus. However, when the apparatus is assembled, it is also possible to adjust the position of the processing tank first and then perform the above-described control. The above-described control can be performed after a pipe is attached to the processing tank. Thus, it is possible to compensate for displacement of the processing tank by taking into account the actual amount of deformation of each part caused by the liquid in the processing tank.

The central axis of rotational movement of the holder griping mechanism 133 by the rotation mechanism 121 of the present embodiment passes through at least part of the holder griping mechanism 133. The center of the holder griping mechanism 133 is preferably located on the central axis of rotational movement of the holder griping mechanism 133. This shortens the distance between the axis of rotation and the center of the substrate, and can accurately control the holder griping mechanism 133. Furthermore, the rotation mechanism 121 of the present embodiment can rotationally move the holder griping mechanism 133 without rotationally moving or linearly moving the arm 115; the rotation mechanism 121 is independent from the substrate transporting section 110. The linear motion mechanism 122 of the present embodiment can linearly move the holder griping mechanism 133 without rotationally moving or linearly moving the arm 115; the linear motion mechanism 122 is independent from the substrate transporting section 110. In other words, displacement of the processing tank can be compensated for independently of the transportation of the substrate. This makes it possible to compensate for displacement of each processing tank without moving the substrate in the transporting direction and the vertical direction. This description is not intended to exclude configurations other than the illustrated configuration.

Figure 7:
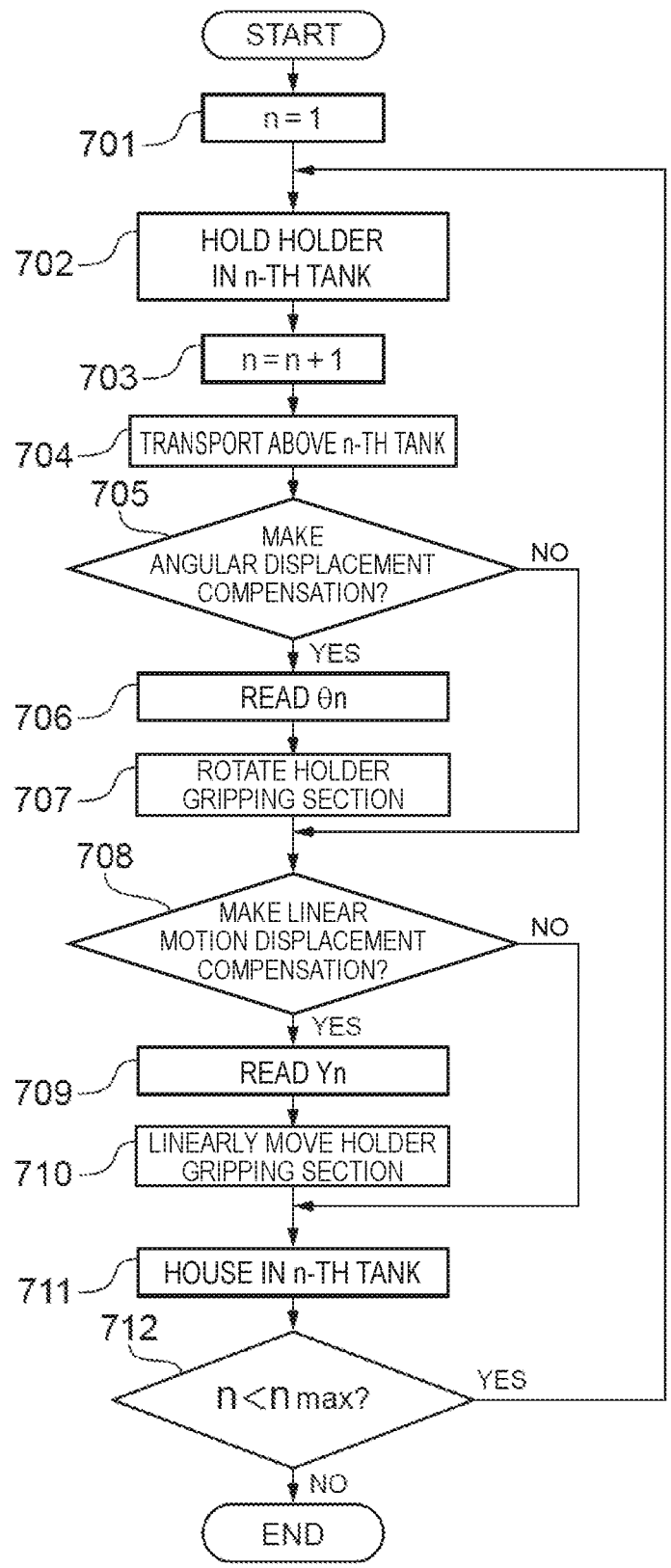
FIG. 7 is a flowchart illustrating a method of compensating for displacement of a processing tank according to the first embodiment.

FIG. 7 is a flowchart illustrating a method of compensating for displacement of the processing tank. A case will be described here as an example where the substrate 131 and the substrate holder 132 housed in the first processing tank 150a are transported to the second processing tank 150b, and they are further transported repeatedly up to the n-th processing tank. For simplicity of description, at the start of control, the holder griping mechanism 133 is assumed to be located above the processing tank in which the substrate 131 and the substrate holder 132 to be transported by the holder griping mechanism 133 are housed. Prior to the start of control, necessity of compensation for angular displacement of the processing tank, necessity of compensation for linear displacement of the processing tank, a processing time $T_n$ at each processing tank and a maximum value $n_{max}$ of n are inputted by the input apparatus 143 and stored in the storage apparatus 142. The angular displacement compensation value $\theta_n$ and the linear displacement compensation value $Y_n$ regarding each processing tank are assumed to be measured in advance and stored in the storage apparatus 142.

Step 701: The control apparatus 141 sets n at the start of control to 1.

Step 702: The control apparatus 141 controls the vertical transporting mechanism 114 and the holder griping mechanism 133 to grip the substrate holder 132 housed in the n-th processing tank. The substrate holder 132 housed in the first processing tank 150a becomes the target at a first round of the loop.

Step 703: The control apparatus 141 designates a numerical value of 1 added to n as new n.

Step 704: The control apparatus 141 controls the horizontal transporting mechanism 112 and the vertical transporting mechanism 114 to transport the substrate 131 and the substrate holder 132 above the n-th processing tank. The second processing tank 150b becomes the target at a first round of the loop.

Step 705: The control apparatus 141 reads the necessity of compensation for angular displacement of the processing tank stored in the storage apparatus 142. The flow proceeds to step 706 if angular displacement needs to be compensated for and the flow proceeds to step 708 if angular displacement need not be compensated for.

Step 706: The control apparatus 141 reads the angular displacement compensation value $\theta_n$ stored in the storage apparatus 142. The angular displacement compensation value $\theta_2$ is read at a first round of the loop.

Step 707: The control apparatus 141 controls the rotation mechanism 121 based on the angular displacement compensation value $\theta_n$ to rotationally move the holder griping mechanism 133.

Step 708: The control apparatus 141 reads the necessity of compensation for linear displacement of the processing tank stored in the storage apparatus 142. The flow proceeds to step 709 if linear displacement needs to be compensated for and the flow proceeds to step 711 if linear displacement need not be compensated for.

Step 709: The control apparatus 141 reads the linear displacement compensation value $Y_n$ stored in the storage apparatus 142. A linear displacement compensation value $Y_2$ is read at a first round of the loop.

Step 710: The control apparatus 141 controls the linear motion mechanism 122 based on the linear displacement compensation value $Y_n$ to linearly move the holder griping mechanism 133.

Step 711: The control apparatus 141 controls the vertical transporting mechanism 114 and the holder griping mechanism 133 to house the substrate 131 and the substrate holder 132 in the n-th processing tank, release griping of the substrate holder 132 by the holder griping mechanism 133 and stand by for a processing time $T_n$. When there are two or more substrates to be transported, the control apparatus 141 may control transportation of another substrate during $T_n$.

Step 712: The control apparatus 141 reads $n_{max}$ from the storage apparatus 142 and determines whether or not the current n is less than $n_{max}$. When the current n is less than $n_{max}$, the flow returns to step 702 and when the current n is not less than $n_{max}$ (that is, when n=$n_{max}$), the control is ended.

The above-described flowchart is an example and steps can be changed, added or deleted or the like. For example, in the above-described flowchart, the control apparatus 141 is assumed to control the rotation mechanism 121 and the linear motion mechanism 122 in different steps. The control apparatus 141 may simultaneously control the rotation mechanism 121 and the linear motion mechanism 122 after reading both the angular displacement compensation value $\theta_n$ and the linear displacement compensation value $Y_n$. The control apparatus 141 may control the rotation mechanism 121 and/or the linear motion mechanism 122 simultaneously with the horizontal transporting mechanism 112 (e.g., between step 703 and step 704). For example, when the electrolytic plating apparatus 100 does not include the rotation mechanism 121 or the linear motion mechanism 122, the corresponding step may be deleted. For example, when the rotation mechanism 121 is provided with a rotary encoder or when the linear motion mechanism 122 is provided with a linear encoder, a step of executing closed loop control may be added. For example, in steps 706 and 709, the user may manually input the angular displacement compensation value $\theta_n$ and the linear displacement compensation value $Y_n$. The angular displacement compensation value $\theta_n$ and the linear displacement compensation value $Y_n$ may be stored with regard to at least one processing tank. Either of the angular displacement compensation value $\theta_n$ and the linear displacement compensation value $Y_n$ may be stored. The displacement compensation value regarding the processing tank in which no displacement compensation value is stored may be regarded as 0. In addition, changes can be made without departing from the spirit and scope of the present invention.

According to the substrate transporting apparatus that performs the above-described control or the control apparatus for the substrate transporting apparatus or the above-described control method, it is possible to automatically compensate for displacement of the processing tank during operation of the electrolytic plating apparatus 100 if the angular displacement compensation value $\theta_n$ and the linear displacement compensation value $Y_n$ relating to the processing tank are once measured and stored.

The above-described control method may be executed by a program. The program may be recorded in a computer (e.g., control apparatus 141)-readable non-transitory recording medium. The non-transitory recording medium may be, for example, the storage apparatus 142. The non-transitory recording medium may be, for example, a CD-ROM or DVD-ROM.

Second Embodiment

In order to execute the flowchart described in the aforementioned embodiment, it is necessary to measure and store displacement compensation values relating to the processing tank in advance. The user may manually measure these compensation values, but time and effort for measurement also increase as the number of processing tanks increases. Thus, the present embodiment will describe a substrate transporting apparatus, a control apparatus for the substrate transporting apparatus, a method, a program and a recording medium in which the program is recorded which automatically acquire displacement compensation values relating to processing tanks.

Figure 8:
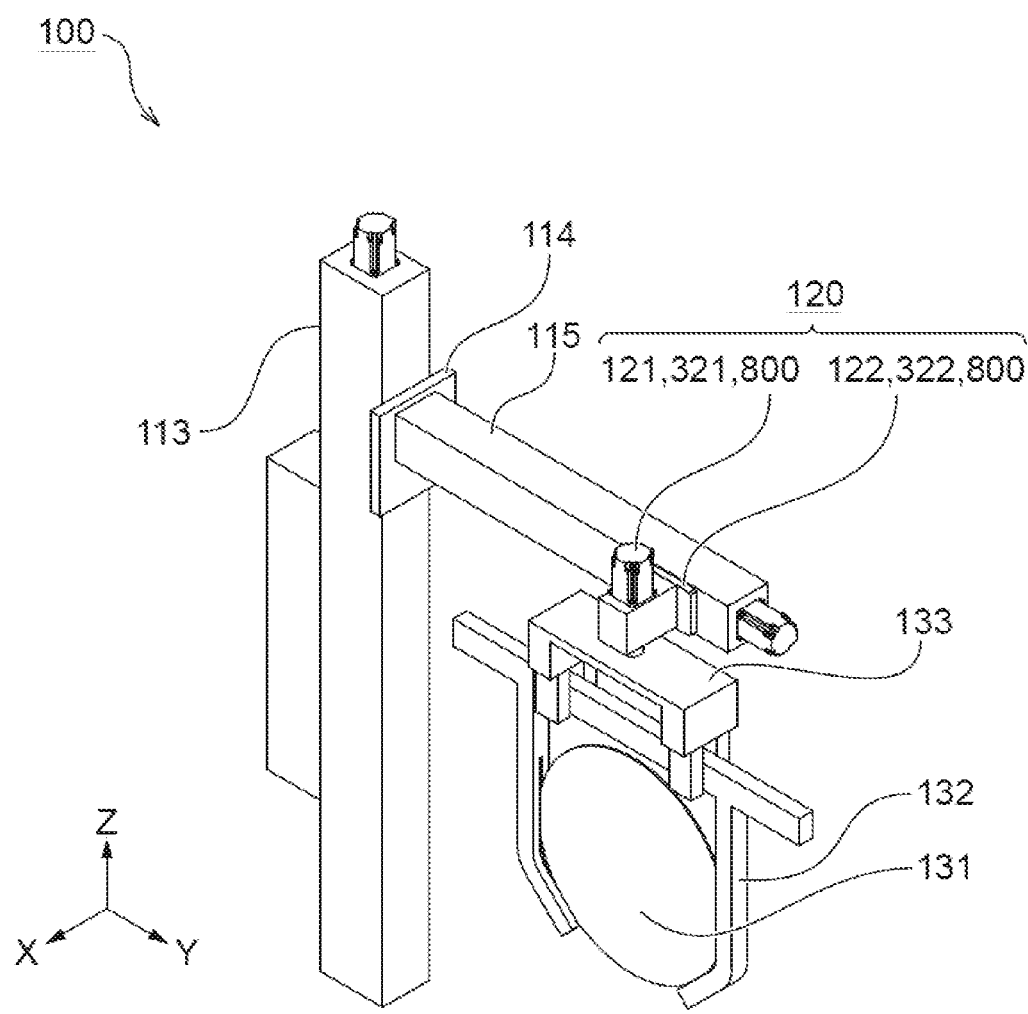
FIG. 8 is a perspective view of a portion of an electrolytic plating apparatus near the arm comprising a collision detection mechanism according to a second embodiment.

FIG. 8 is a perspective view of a portion of the electrolytic plating apparatus 100 near the arm 115 according to the present embodiment. The electrolytic plating apparatus 100 shown in FIG. 8 comprises a collision detection mechanism 800 in addition to the configuration described so far.

The collision detection mechanism 800 is any given mechanism that detects collision between the substrate holder 132 and a processing tank. However, in the case of a configuration in which the substrate holder 132 is not housed in the processing tank (e.g., configuration in which the substrate holder 132 holds only a top end portion of the substrate 131), collision between the substrate 131 and the processing tank may be detected. In this case, the substrate 131 may be a dummy substrate. The collision detection mechanism 800 in the example in FIG. 8 is a mechanism that detects collision between the substrate holder 132 and the processing tank based on a change in the load of the rotation mechanism 121 and the linear motion mechanism 122. Various mechanisms such as a current-detecting sensor, capacitance sensor, acceleration sensor, micro-switch or the like can be adopted as the collision detection mechanism 800.

With the substrate holder 132 housed in a predetermined processing tank, the control apparatus 141 controls the rotation mechanism 121 to rotationally move the holder griping mechanism 133 in one direction until the collision detection mechanism 800 detects collision between the substrate holder 132 and the processing tank. When collision is detected, the control apparatus 141 stops rotational movement of the holder griping mechanism 133 by the rotation mechanism 121. The control apparatus 141 stores an amount of rotation of the holder griping mechanism 133 in the storage apparatus 142 until collision is detected. The control apparatus 141 calculates an angular displacement compensation value $\theta_n$ relating to this processing tank based on the stored amount of rotation. Further using the amount of rotation until the substrate holder 132 collides with the processing tank when the holder griping mechanism 133 is rotationally moved in another direction, $\theta_n$ may be calculated from an average value of amounts of rotations at the time of collisions.

Regarding the rotation of the holder griping mechanism 133, a counterclockwise rotation when the apparatus is seen from a top view will be described as a positive direction and a clockwise rotation will be described as a negative direction hereinafter. For example, suppose that collision is detected when the holder griping mechanism 133 is rotationally moved by +5 degrees from a state in which the amount of rotation is 0. Furthermore, suppose that collision is detected when the holder griping mechanism 133 is rotationally moved by −1 degree after the amount of rotation is returned to 0. In that case, the control apparatus 141 calculates $\theta_n$ relating to the processing tank as +2 degrees ($\{5+(-1)\}/2=2$) and stores it in the storage apparatus 142.

A technique similar to the technique of measuring the angular displacement compensation value $\theta_n$ may be used to also measure the linear displacement compensation value $Y_n$. Linear motion of the holder griping mechanism 133 will be described hereinafter assuming that the direction in which the holder griping mechanism 133 goes away from the horizontal guide 111 is a positive direction and the direction in which the holder griping mechanism 133 approaches the horizontal guide 111 is a negative direction. For example, suppose that collision is detected when the holder griping mechanism 133 is linearly moved by +3.0 centimeters from a state in which the amount of linear motion is 0. Furthermore, suppose that collision is detected when the holder griping mechanism 133 is linearly moved by −2.0 centimeters after the amount of linear motion is returned to 0. In that case, the control apparatus 141 calculates $Y_n$ relating to the processing tank as +0.5 centimeters and stores it in the storage apparatus 142.

Figure 9:
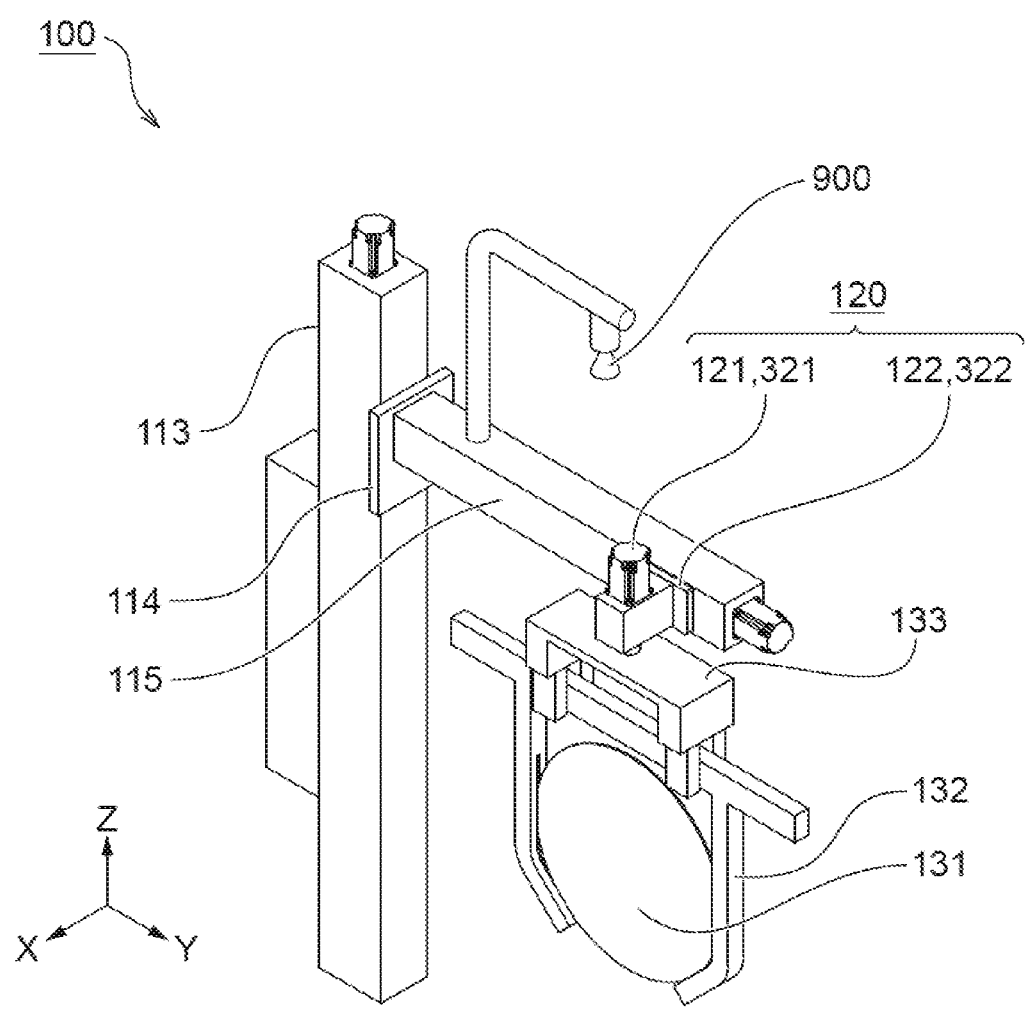
FIG. 9 is a perspective view of a portion of an electrolytic plating apparatus near the arm comprising a camera according to the second embodiment.

FIG. 9 is a perspective view of a portion of the electrolytic plating apparatus 100 near the arm 115, wherein the electrolytic plating apparatus 100 comprises a camera 900 instead of the collision detection mechanism 800. The camera 900 is preferably provided at a position where the camera 900 can take images of the substrate 131 and the processing tank 150. In the example in FIG. 9, the camera 900 is provided on the arm 115. The electrolytic plating apparatus 100 may comprise a plurality of cameras 900 or may have a configuration that can change the image taking direction of the camera 900.

The control apparatus 141 processes an image acquired by the camera 900 and thereby obtains a positional relationship between the substrate 131 and a predetermined processing tank. The control apparatus 141 calculates a displacement compensation value (e.g., both or either one of angular displacement compensation value $\theta_n$ and linear displacement compensation value $Y_n$) relating to the processing tank from the positional relationship between the substrate 131 and the processing tank. It may be possible to obtain the positional relationship between the substrate 131 and the processing tank using an optical positioning meter or the like instead of the camera 900.

According to the substrate transporting apparatus or the control apparatus for the substrate transporting apparatus or the above-described method that performs the above-described control, it is possible to automatically acquire displacement compensation values for the respective processing tanks 150.

The above-described method may be implemented by a program. The program may be recorded in a computer (e.g., control apparatus 141)-readable non-transitory recording medium. The non-transitory recording medium may be, for example, the storage apparatus 142. The non-transitory recording medium may be, for example, a CD-ROM or DVD-ROM.

Third Embodiment

Manufacturing errors and assembly errors may occur in manufacturing and assembly of a substrate holder of an electrolytic plating apparatus. Manufacturing errors and assembly errors may cause displacement between the actual shape and an ideal shape of the substrate holder. When there is displacement in the substrate holder, the substrate transporting apparatus may not be able to house a substrate at a predetermined position of the processing tank. As a result, when, for example, the apparatus is an electrolytic plating apparatus, a current density may deviate from a desired value, which may degrade plating quality. When the electrolytic plating apparatus includes a plurality of substrate holders, the plating quality may vary depending on the substrate holder used. Thus, the present embodiment will describe a substrate transporting apparatus that compensates for displacement of a substrate holder, a control apparatus for the substrate transporting apparatus, a displacement compensation method, a program for implementing the method and a recording medium in which the program is recorded.

The "displacement of a substrate holder" in the present specification is displacement between the actual shape and an ideal shape of the substrate holder 132 and refers to displacement that may cause the electrolytic plating apparatus 100 to be prevented from housing the substrate 131 at a predetermined position of the processing tank. Examples of displacement of the substrate holder include displacement by a manufacturing error, displacement by an assembly error, and displacement by deformation; any displacements caused by any causes will be included. Examples of displacement of the substrate holder include displacement that can be expressed by an amount of rotation around any given direction as an axis and displacement that can be expressed by an amount of linear motion in any given direction.

Examples of displacement of the substrate holder 132 in particular include angular displacement and linear displacement.

The "compensation for displacement of the substrate holder" in the present specification refers to cancellation of displacement of the substrate holder 132 by some means. However, displacement of the substrate holder 132 need not always be cancelled completely. The electrolytic plating apparatus 100 according to the present embodiment compensates for displacement of the substrate holder 132 by operating the moving mechanism 120.

The "displacement compensation value relating to the substrate holder" in the present specification refers to an amount of movement of the holder griping mechanism 133 to compensate for displacement of the substrate holder 132. The displacement compensation value with respect to a k-th substrate holder includes an angular displacement compensation value $\theta'_k$ and a linear displacement compensation value $Y'_k$.

The "angular displacement compensation value $\theta'_k$" in the present specification refers to an amount of rotation of the holder griping mechanism 133 by the rotation mechanism 121 to compensate for angular displacement of the k-th substrate holder. The angular displacement compensation value $\theta'_k$ preferably coincides with angular displacement of the k-th substrate holder. Hereinafter, the angular displacement compensation value $\theta'_k$ when angular displacement of the substrate holder is 0 is assumed to be 0.

The "linear displacement compensation value $Y'_k$" in the present specification refers to an amount of linear motion of the holder griping mechanism 133 by the linear motion mechanism 122 to compensate for linear displacement of the k-th substrate holder. The linear displacement compensation value $Y'_k$ preferably coincides with linear displacement of the k-th substrate holder. Hereinafter, the linear displacement compensation value $Y'_k$ when the linear displacement of the substrate holder is 0 is assumed to be 0.

Figure 10:
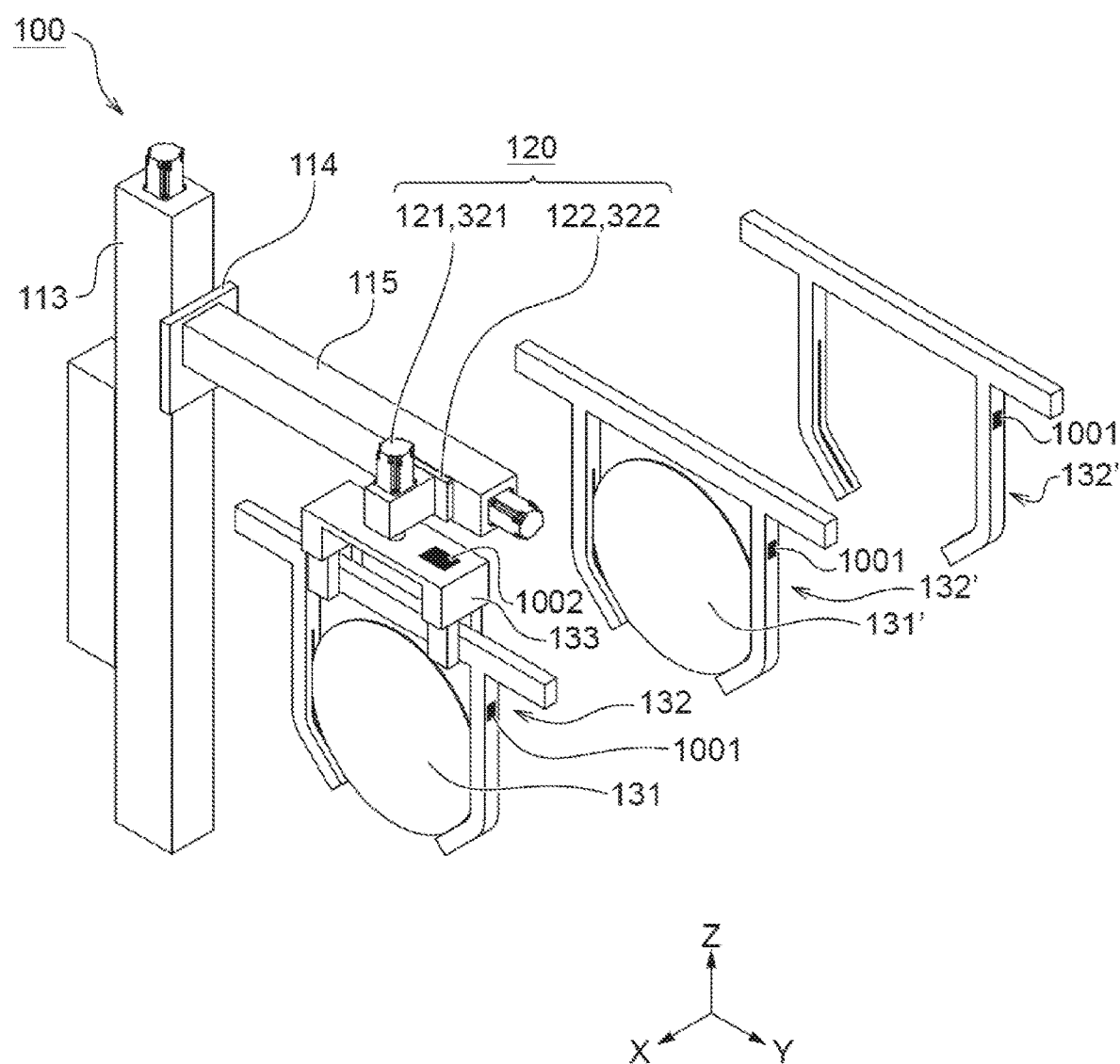
FIG. 10 is a perspective view of a portion of an electrolytic plating apparatus near the arm according to a third embodiment.

FIG. 10 is a perspective view of a portion of the electrolytic plating apparatus 100 near the arm 115 according to the present embodiment. The number of substrate holders 132 provided is one or plural. The substrate holder 132 may be stored in a stocker (not shown) or may be housed in any one of the plurality of processing tanks 150. FIG. 10 illustrates not only the substrate holder 132 but also a substrate holder 132' holding the substrate 131' and a substrate holder 132" not holding any substrate. An ID tag 1001 is attached to the substrate holder 132. A one-dimensional barcode, two-dimensional barcode. RFID tag or the like can be adopted as the ID tag 1001. An ID number to identify the substrate holder 132 is stored in the ID tag 1001. When there are a plurality of substrate holders 132, all the plurality of substrate holders 132 are preferably provided with ID tags. However, if at least one of the plurality of substrate holders 132 is provided with an ID tag, it is possible to perform control which will be described below. The plurality of substrate holders 132 may be housed in different processing tanks or may be stored in a holder stocker (not shown).

The electrolytic plating apparatus 100 comprises an ID reading apparatus 1002 to read information of the ID tag 1001. The ID reading apparatus 1002 can be disposed at any position as long as it can read the information of the ID tag 1001. The ID reading apparatus 1002 of the present embodiment is provided on the holder griping mechanism 133.

Figure 11:
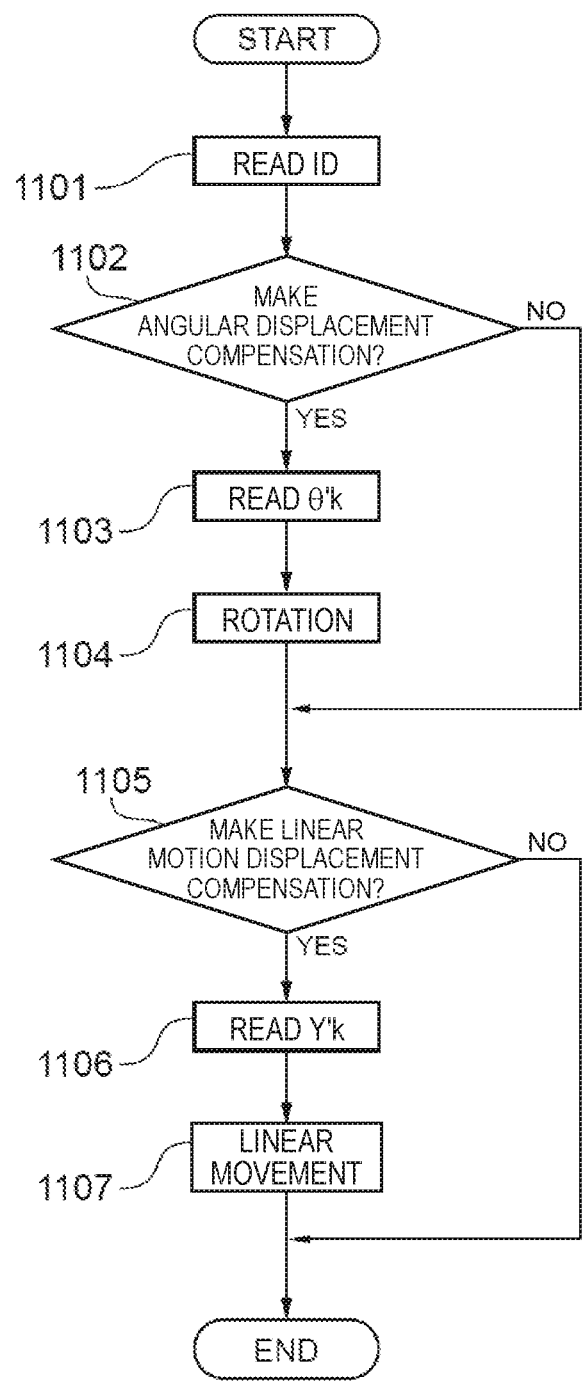
FIG. 11 is a flowchart illustrating a method of compensating for displacement of a substrate holder according to the third embodiment.

FIG. 11 is a flowchart illustrating a method of compensating for displacement of the substrate holder 132. Description is given here assuming that the flowchart in FIG. 11 is executed between steps 710 and 711 of the flowchart shown in FIG. 7. Prior to starting the control, the necessity of compensation for angular displacement of the substrate holder 132 and the necessity of compensation for linear displacement of the substrate holder 132 are inputted via the input apparatus 143 and stored in the storage apparatus 142. Angular displacement compensation value $\theta'_k$ and linear displacement compensation value $Y'_k$ relating to each substrate holder are assumed to be measured in advance and stored in the storage apparatus 142.

Step 1101: The control apparatus 141 controls the ID reading apparatus 1002 so as to read the ID tag 1001 and identify an ID number of the substrate holder 132 which is currently griped by the holder griping mechanism 133.

Step 1102: The control apparatus 141 reads the necessity of compensation for angular displacement of the substrate holder 132 stored in the storage apparatus 142. The control apparatus 141 proceeds to step 1103 if compensation for angular displacement is necessary and proceeds to step 1105 if compensation for angular displacement is unnecessary.

Step 1103: The control apparatus 141 reads the angular displacement compensation value $\theta'_k$ relating to the substrate holder 132 whose ID number is identified from the storage apparatus 142.

Step 1104: The control apparatus 141 controls the rotation mechanism 121 based on the angular displacement compensation value $\theta'_k$ to rotationally move the holder griping mechanism 133.

Step 1105: The control apparatus 141 reads the necessity of compensation for linear displacement of the substrate holder 132 stored in the storage apparatus 142. The control apparatus 141 proceeds to step 1106 if compensation for linear displacement is necessary and ends the processing if compensation for linear displacement is unnecessary ("ends the processing" means "proceeds to step 711").

Step 1106: The control apparatus 141 reads the linear displacement compensation value $Y'_k$ relating to the substrate holder 132 whose ID number is identified from the storage apparatus 142.

Step 1107: The control apparatus 141 controls the linear motion mechanism 122 based on the linear displacement compensation value $Y'_k$ to linearly move the holder griping mechanism 133. After that, the control apparatus 141 ends the processing (proceeds to step 711).

The flowchart described so far is an example, and steps can be changed, added or deleted or the like. For example, the above-described flowchart may be executed between steps 703 and 704. The above-described flowchart may also be executed in step 711 before releasing griping of the substrate holder 132. $\theta'_k$ and $Y'_k$ may be recorded in the ID tag 1001. For example, when the electrolytic plating apparatus 100 does not include the rotation mechanism 121 or the linear motion mechanism 122, their corresponding steps may be deleted. The ID number of the substrate holder 132 may also be identified by the user visually reading the ID tag 1001. The above-described flowchart shows an example where the holder griping mechanism 133 is rotationally moved based on $\theta_n$ in step 706 and the holder griping mechanism 133 is then rotationally moved based on $\theta'_k$ in step 1103 (the rotation mechanism 121 operates twice during the processing). Instead, a technique may also be adopted whereby the substrate is rotationally moved based on a value of addition or subtraction between $\theta_n$ and $\theta'_k$ (the rotation mechanism 121 operates only once during the processing). In step 1103 and step 1106, the user may manually input the angular displacement compensation value $\theta'_k$ and the linear displacement compensation value $Y'_k$. The angular displacement compensation value $\theta'_k$ and the linear displacement compensation value $Y'_k$ need only to be stored regarding at least one substrate holder. Either of the angular displacement compensation value $\theta'_k$ and the linear displacement compensation value $Y'_k$ may be stored. If the ID tag 1001 of the substrate holder 132 cannot be read in step 1101 (for example, if the ID tag 1001 is not assigned to the substrate holder 132 or the like), the control apparatus 141 may identify the ID number of the substrate holder 132 as "no ID number." Control may be performed by regarding a displacement compensation value relating to the "no ID number" holder or the substrate holder 132 in which no displacement compensation value is stored as 0.

The substrate transporting apparatus may compensate for either or both of displacement of the processing tank and displacement of the substrate holder. When both of displacement of the processing tank and displacement of the substrate holder are compensated for, it would be possible to house the substrate at a predetermined position of the processing tank with higher accuracy than when either of them is compensated for.

The angular displacement compensation value $\theta'_k$ and the linear displacement compensation value $Y'_k$ may be manually measured for each holder or may be automatically acquired by applying the method described in the second embodiment to the substrate holder 132 or by the other manners.

According to the substrate transporting apparatus or the control apparatus for the substrate transporting apparatus or the above-described displacement compensation method that performs the above-described control, it is possible to compensate for displacement of the substrate holder and house the substrate at an ideal position (or position close to an ideal position) of the processing tank. As a result, for example, when the apparatus is an electrolytic plating apparatus, it is possible to reduce variations in the plating quality caused by the substrate holder used.

Furthermore, the above-described displacement compensation method may be implemented by a program. The program may be recorded in a computer (e.g., control apparatus 141)-readable non-transitory recording medium. The non-transitory recording medium may be, for example, the storage apparatus 142. The non-transitory recording medium may be, for example, a CD-ROM or DVD-ROM.

Fourth Embodiment

The present embodiment will describe a substrate transporting apparatus provided with a first substrate inclination mechanism and/or a second substrate inclination mechanism as the moving mechanism in addition to the embodiments described so far.

Figure 12:
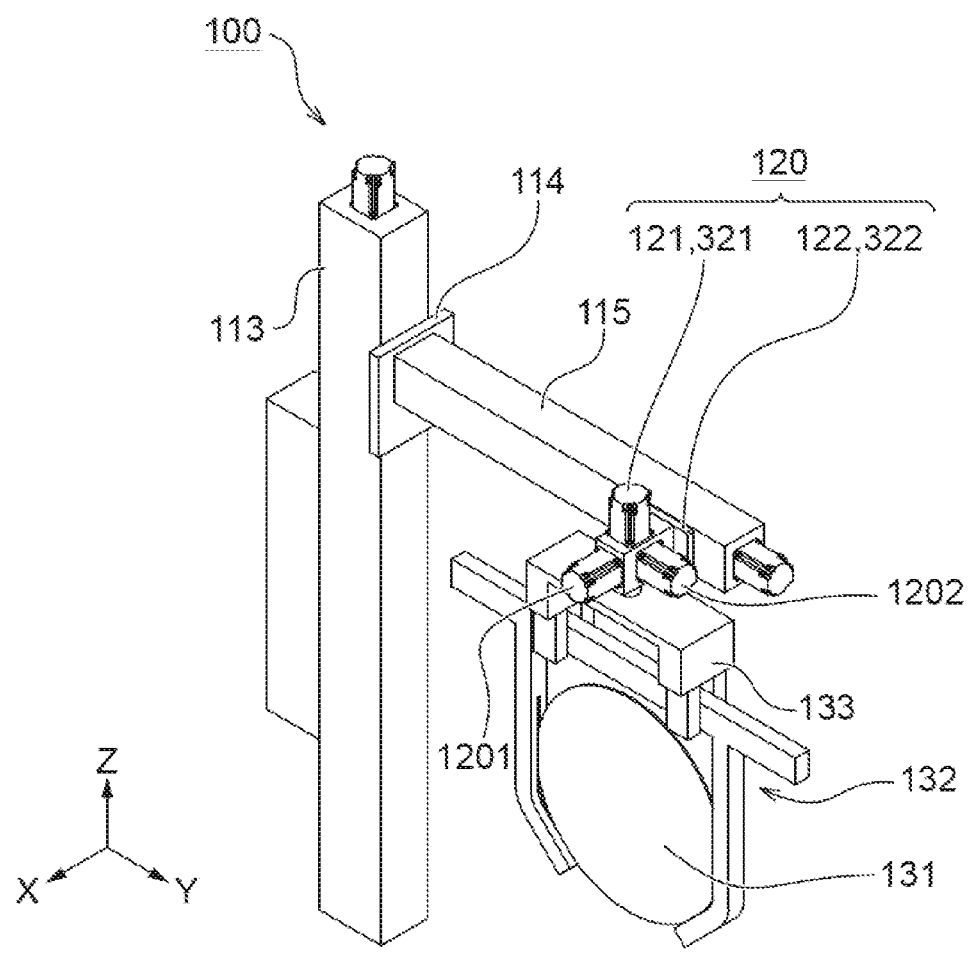
FIG. 12 is a perspective view of a portion of an electrolytic plating apparatus near the arm according to a fourth embodiment.

FIG. 12 is a perspective view of a portion of the present embodiment near the arm 115. The electrolytic plating apparatus 100 according to the present embodiment further comprises a first inclination mechanism 1201 and a second inclination mechanism 1202 as the moving mechanism 120. The first inclination mechanism 1201 and the second inclination mechanism 1202 are provided between the rotation mechanism 121 and the holder griping mechanism 133. The first inclination mechanism 1201 is a mechanism that moves the holder griping mechanism 133 inclined in the longitudinal direction (X-axis direction) of the horizontal guide 111 as an axis. The second inclination mechanism 1202 is a mechanism that moves the holder griping mechanism 133 inclined in the longitudinal direction (Y-axis direction) of the arm 115 as an axis. The electrolytic plating apparatus 100 may comprise either of the first inclination mechanism 1201 and the second inclination mechanism 1202. The control apparatus 141 according to the present embodiment controls the first inclination mechanism 1201 and/or the second inclination mechanism 1202 using a technique similar to that of the rotation mechanism 121 and the linear motion mechanism 122. The electrolytic plating apparatus 100 may further comprise the collision detection mechanism 800 and/or the camera 900).

According to the substrate transporting apparatus or the control apparatus for the substrate transporting apparatus or the above-described displacement compensation method that performs the above-described control, it is possible to compensate for displacement of the processing tank even when the processing tank is inclined around the X-axis or Y-axis. Furthermore, according to the above-described substrate transporting apparatus, control apparatus or displacement compensation method, it is possible to compensate for displacement of the substrate holder even when the substrate holder holds the substrate, inclined around the X-axis or Y-axis.

The first inclination mechanism 1201 and the second inclination mechanism 1202 of the present embodiment are located above a plurality of processing tanks 150. It is thereby possible to accurately compensate for displacement of each processing tank and the substrate holder. Furthermore, the first inclination mechanism 1201 and the second inclination mechanism 1202 of the present embodiment can incline the holder griping mechanism 133 independent from the substrate transporting section 110. It is thereby possible to compensate for displacement of each processing tank and the substrate holder without moving the substrate in the transporting direction or the vertical direction. However, such description is not intended to exclude configurations other than the illustrated configuration.

The above-described displacement compensation method may be implemented by a program. The program may be recorded in a computer (e.g., control apparatus 141)-readable non-transitory recording medium. The non-transitory recording medium may be, for example, the storage apparatus 142. The non-transitory recording medium may be, for example, a CD-ROM or DVD-ROM or the like.

Fifth Embodiment

The first embodiment has been described assuming that the angular displacement compensation value $\theta_n$ and the linear displacement compensation value $Y_n$ relating to each processing tank are measured in advance and stored in the storage apparatus 142. A fifth embodiment will describe a substrate transporting apparatus, a control apparatus for the substrate transporting apparatus, a method, a program and a recording medium in which the program is recorded without the need for measuring these compensation values in advance. The electrolytic plating apparatus 100 of the present embodiment is provided with the collision detection mechanism 800, the camera 900 or the optical positioning meter or the like described in the second embodiment, and automatically acquires displacement compensation values during transportation of a substrate.

Figure 13:
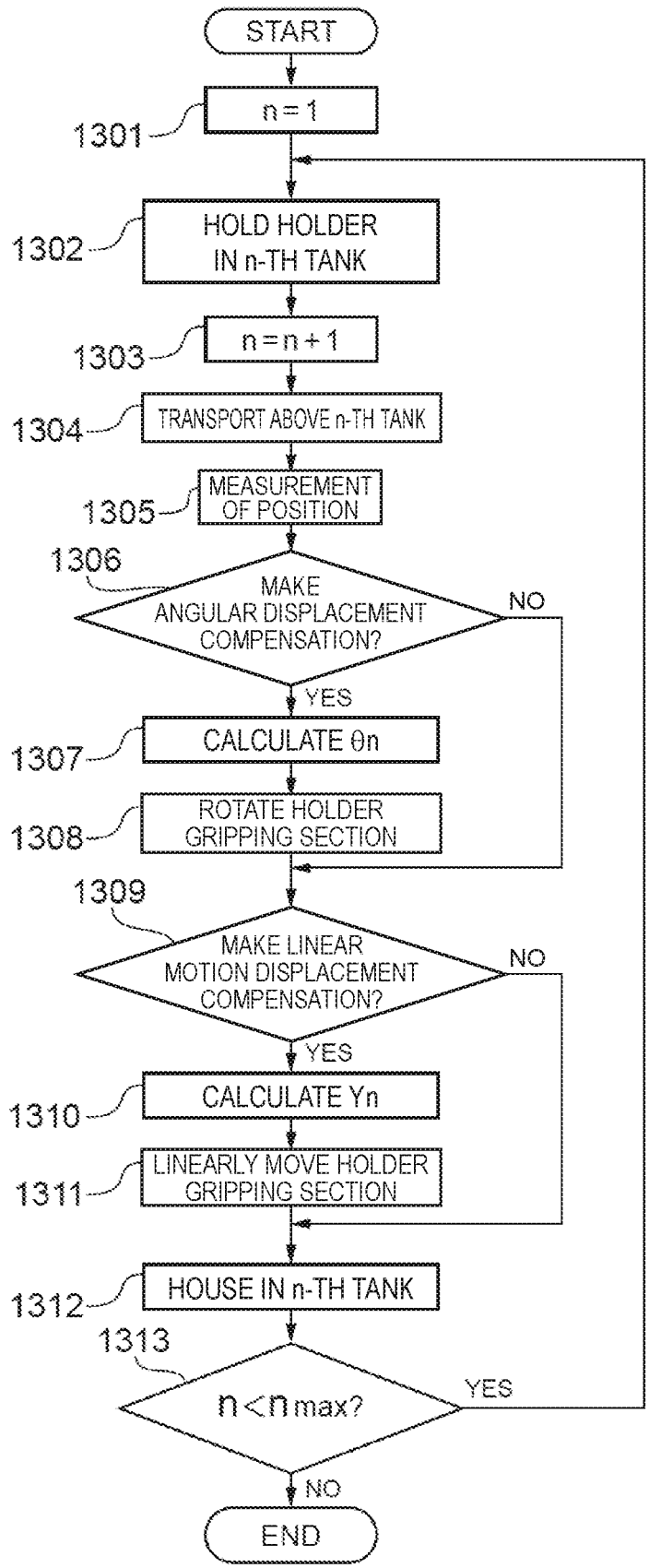
FIG. 13 is a flowchart illustrating a method of compensating for displacement of a processing tank according to a fifth embodiment.

FIG. 13 is a flowchart illustrating a method of compensating for displacement of a processing tank of the present embodiment. Here, a case will be described where the electrolytic plating apparatus 100 comprises an optical positioning meter. Control conditions of this flowchart are equivalent to those in the case shown by the flowchart in FIG. 7, except that the angular displacement compensation value $\theta_n$ and the linear displacement compensation value $Y_n$ relating to each processing tank are not measured in advance.

Step 1301 to step 1304: These steps are equivalent to step 701 to step 704.

Step 1305: The control apparatus 141 performs a measurement of position using an optical positioning meter and acquires a positional relationship between the substrate 131 and the n-th processing tank.

Step 1306: This step is equivalent to step 705.

Step 1307: The control apparatus 141 calculates the angular displacement compensation value $\theta_n$ from the positional relationship between the substrate 131 and the n-th processing tank acquired in step 1305.

Step 1308 and step 1309: These steps are equivalent to steps 707 and 708.

Step 1310: The control apparatus 141 calculates the linear displacement compensation value $Y_n$ from the positional relationship between the substrate 131 and the n-th processing tank acquired in step 1305.

Step 1311 to step 1313: These steps are equivalent to steps 710 to 712.

The above-described flowchart is an example, and steps can be changed, added or deleted or the like. The control apparatus 141 may calculate displacement compensation values immediately after performing the positional measurement in step 1305. The control apparatus 141 may store the calculated displacement compensation values in the storage apparatus 142 and use stored displacement compensation values in the next and subsequent transportations. The control apparatus 141 may calculate a displacement compensation value every time transportation is performed. In this case, there is an effect that it is possible to handle variations over the time of displacement compensation values. When the electrolytic plating apparatus 100 is provided with the collision detection mechanism 800 or the camera 900 instead of the optical positioning meter, displacement compensation values may be calculated using them. The flowchart in FIG. 13 may be applied not to displacement compensation values relating to the processing tank but to displacement compensation values relating to the holder.

The above-described control method may be implemented by a program. The program may be recorded in a computer (e.g., control apparatus 141)-readable non-transitory recording medium. The non-transitory recording medium may be, for example, the storage apparatus 142. The non-transitory recording medium may be, for example, a CD-ROM or DVD-ROM.

Although several embodiments of the present invention have been described so far, the above-described embodiments are intended to make easier an understanding of the present invention and not to limit the present invention. The present invention is also applicable to an apparatus provided with a plurality of horizontal guides (e.g., apparatus provided with two horizontal guides arranged so as to face each other such that the respective guides can transport a substrate in two lanes). The present invention is also applicable to an apparatus provided with a plurality of horizontal transporting mechanisms provided for one horizontal guide.

As described above, it goes without saying that the present invention may be changed and modified, and the present invention can include its equivalents without departing from the spirit and scope of the present invention. Within a scope in which at least some of the aforementioned problems can be solved or a scope in which at least some of the effects of the present invention can be achieved, any combination or omission of each component described in the scope of claims and the specification is possible.

As an embodiment, the present application discloses a substrate transporting apparatus provided with a substrate holder for holding a substrate, a holder griping mechanism that grips the substrate holder, a substrate transporting section that transports the substrate holder, a rotation mechanism that rotationally moves the holder griping mechanism around a vertical direction as an axis, and a linear motion mechanism that linearly moves the holder griping mechanism in a direction perpendicular to a plane defined by a direction in which the substrate holder is transported by the substrate transporting section and a vertical direction.

This substrate transporting apparatus comprises the rotation mechanism and the linear motion mechanism, and thereby provides an effect that it is possible to rotationally move and linearly move the holder griping mechanism and compensate for displacement of the processing tank and/or displacement of the substrate holder as an example. This apparatus is able to compensate for displacement of the processing tank, and thereby provides an effect that it is possible to save time, effort and cost of assembly of the apparatus as an example. This apparatus is able to compensate for displacement of the substrate holder, and thereby provides an effect that it is possible to house a substrate at an ideal position (or a position close to an ideal position) of the processing tank as an example.

As an embodiment, the present application further discloses a control apparatus for a substrate transporting apparatus, wherein the substrate transporting apparatus comprises one or a plurality of substrate holders for holding substrates, a holder griping mechanism that grips one of the one or the plurality of substrate holders, one or a plurality of processing tanks for processing the substrates and a moving mechanism for moving the holder griping mechanism, and wherein the control apparatus controls the moving mechanism based on a displacement compensation value relating to a predetermined substrate holder so as to compensate for displacement of the predetermined substrate holder.

Furthermore, as an embodiment, the present application discloses a control apparatus for a substrate transporting apparatus, wherein the substrate transporting apparatus comprises a storage apparatus that stores displacement compensation values relating to at least one of one or a plurality of substrate holders and an ID reading apparatus, wherein at least one of the one or the plurality of substrate holders comprises an ID tag, and wherein the control apparatus reads information of the ID tag of the predetermined substrate holder through the ID reading apparatus to thereby identify an ID number of the predetermined substrate holder and read a displacement compensation value relating to the predetermined substrate holder from the storage apparatus based on the ID number.

These control apparatuses provide an effect of allowing the substrate transporting apparatus provided with a predetermined configuration to perform control to compensate for displacement of the processing tank or control to compensate for displacement of the substrate holder as an example.

Furthermore, as an embodiment, the present application discloses a displacement compensation method for a substrate transporting apparatus for housing a substrate in a processing tank, including a step of operating a moving mechanism for moving a holder griping mechanism and compensating for displacement of a predetermined processing tank, a program for the substrate transporting apparatus that implements such method and a non-transitory recording medium in which such program is recorded.

Furthermore, as an embodiment, the present application discloses the displacement compensation method, in which the step of compensating for displacement of a predetermined processing tank includes a step of controlling the moving mechanism based on a displacement compensation value relating to the predetermined processing tank.

The methods, program and recording medium are able to compensate for displacement of the processing tank based on a displacement compensation value, and thereby provide an effect that it is possible to reduce time, effort and cost of assembly of the apparatus as an example.

Furthermore, as an embodiment, the present application discloses a displacement compensation method for a substrate transporting apparatus for housing a substrate in a processing tank, wherein the substrate transporting apparatus comprises one or a plurality of substrate holders for holding substrates, and a holder griping mechanism that grips one of the one or the plurality of substrate holders, wherein the displacement compensation method includes a step of operating a moving mechanism for moving the holder griping mechanism and compensating for displacement of the predetermined substrate holder, a program for the substrate transporting apparatus that implements such method and a non-transitory recording medium in which such program is recorded.

The method, program and recording medium provide an effect that it is possible to compensate for displacement of the substrate holder as an example. The method, program and recording medium compensate for displacement of the substrate holder and thereby provide an effect that it is possible to house the substrate at an ideal position (or a position close to an ideal position) of the processing tank as an example.

REFERENCE SIGNS LIST

100 . . . Electrolytic plating apparatus
110 . . . Substrate transporting section
111 . . . Horizontal guide
112 . . . Horizontal transporting mechanism
113 . . . Vertical guide
114 . . . Vertical transporting mechanism
115 . . . Arm
120 . . . Moving mechanism
121 . . . Rotation mechanism
122 . . . Linear motion mechanism
131, 131' . . . Substrate
132, 132', 132" . . . Substrate holder
133 . . . Holder griping mechanism
140 . . . Control unit
141 . . . Control apparatus
142 . . . Storage apparatus
143 . . . Input apparatus
150 . . . Plurality of processing tanks
150a to f . . . First to sixth processing tank
321 . . . Rotary encoder
322 . . . Linear encoder
800 . . . Collision detection mechanism
900 . . . Camera
1001 . . . ID tag
1002 . . . ID reading apparatus
1201 . . . First inclination mechanism
1202 . . . Second inclination mechanism

What is claimed is:

1. A substrate transporting apparatus comprising:
a plurality of substrate holders configured to hold substrates;
a holder gripper configured to grip each substrate holder;
a substrate transporting section that includes a horizontal guide, a vertical guide, and an arm on which the holder gripper is mounted, the arm configured to move along the horizontal guide and the vertical guide;
a rotation mechanism configured to rotate the holder gripper about a vertical direction axis;
a linear motion mechanism configured to linearly move the holder gripper in a direction perpendicular to a plane defined by the horizontal guide and the vertical guide;
a plurality of processing tanks configured to process the substrates;
a controller;
a memory that stores a first angular displacement compensation value and a first linear displacement compensation value relating to each of the plurality of processing tanks;
wherein the controller controls the rotation mechanism and the linear motion mechanism based on the first angular displacement compensation value and the first linear displacement compensation value so as to compensate for displacement of each of the plurality of the processing tanks;
wherein the memory further stores a second angular displacement compensation value and a second linear displacement compensation value relating to each of the plurality of substrate holders; and
wherein the controller controls the rotation mechanism and the linear motion mechanism based on the second angular displacement compensation value and the second linear displacement compensation value so as to compensate for displacement of each of the plurality of substrate holders.

2. The substrate transporting apparatus according to claim 1, wherein the vertical axis about which the holder gripper rotates by the rotation mechanism passes through at least part of the holder gripper.

3. The substrate transporting apparatus according to claim 1, further comprising a first inclination mechanism that rotates the holder gripper about an axis parallel to the horizontal guide.

4. The substrate transporting apparatus according to claim 1, further comprising a second inclination mechanism that rotates the holder gripper about an axis perpendicular to the plane defined by the horizontal guide and the vertical guide.

5. A displacement compensation method for a substrate transporting apparatus as recited in claim 1 for housing a substrate in a processing tank using a substrate holder, wherein the method comprises a step of operating the linear motion mechanism for moving the holder griping mechanism and compensating for displacement of a predetermined processing tank and/or displacement of a predetermined substrate holder.

* * * * *